(12) United States Patent
Lee et al.

(10) Patent No.: US 11,653,550 B2
(45) Date of Patent: May 16, 2023

(54) DISPLAY DEVICE AND METHOD FOR MANUFACTURING THE SAME

(71) Applicant: SAMSUNG DISPLAY CO., LTD., Yongin-si (KR)

(72) Inventors: Joongmok Lee, Suwon-si (KR); Jeongeun Park, Goyang-si (KR); Hanho Park, Yongin-si (KR); Chung-Seok Lee, Hwaseong-si (KR); Soyeon Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 154 days.

(21) Appl. No.: 17/210,518

(22) Filed: Mar. 24, 2021

(65) Prior Publication Data
US 2022/0085120 A1   Mar. 17, 2022

(30) Foreign Application Priority Data

Sep. 14, 2020  (KR) .................. 10-2020-0117625

(51) Int. Cl.
*H01L 27/32* (2006.01)
*H05K 1/18* (2006.01)

(52) U.S. Cl.
CPC ...... *H01L 27/3223* (2013.01); *H01L 27/3276* (2013.01); *H05K 1/189* (2013.01); *H01L 2227/323* (2013.01)

(58) Field of Classification Search
CPC . H01L 27/3233; H01L 27/3276; H05K 1/189; H05K 3/0008; H05K 3/4638
See application file for complete search history.

(56) References Cited

U.S. PATENT DOCUMENTS

| | | | |
|---|---|---|---|
| 9,831,432 B2 | 11/2017 | Im | |
| 10,064,274 B2 * | 8/2018 | Kim | ................. H05K 1/11 |
| 10,303,014 B2 * | 5/2019 | Oh | ............. H01L 27/3276 |
| 10,651,260 B2 * | 5/2020 | Lee | ............. H01L 27/3258 |
| 2007/0052344 A1 * | 3/2007 | Wen | ............. H05K 13/0486 |
| | | | 313/498 |
| 2015/0366049 A1 * | 12/2015 | Lee | ............. G02F 1/13458 |
| | | | 361/767 |

FOREIGN PATENT DOCUMENTS

KR   10-2017-0039813   4/2017
KR   10-2019-0026497   3/2019

* cited by examiner

*Primary Examiner* — Sardis F Azongha
(74) *Attorney, Agent, or Firm* — H.C. Park & Associates, PLC

(57) ABSTRACT

A display device includes a display panel including a plurality of display pads at least some of which at least a portion extend in a first direction and are arranged in a second direction intersecting the first direction, and a flexible circuit board including circuit pads, at least some of which at are electrically connected to the display pads, and circuit lines connected to the circuit pads. The circuit pads include at least one dummy pad, and the circuit lines include a dummy circuit line, of which at least a portion of is connected to the at least one dummy pad. The dummy circuit line includes a first portion connected to the at least one dummy pad and a second portion spaced apart from the first portion by a gap.

20 Claims, 18 Drawing Sheets

FIG. 3A
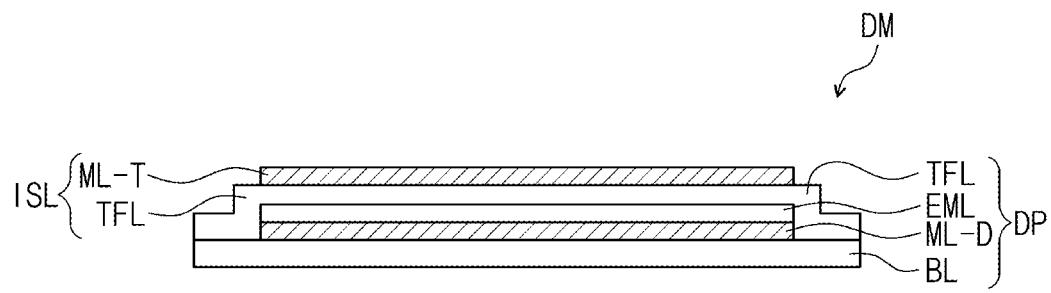
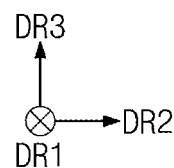
FIG. 3B
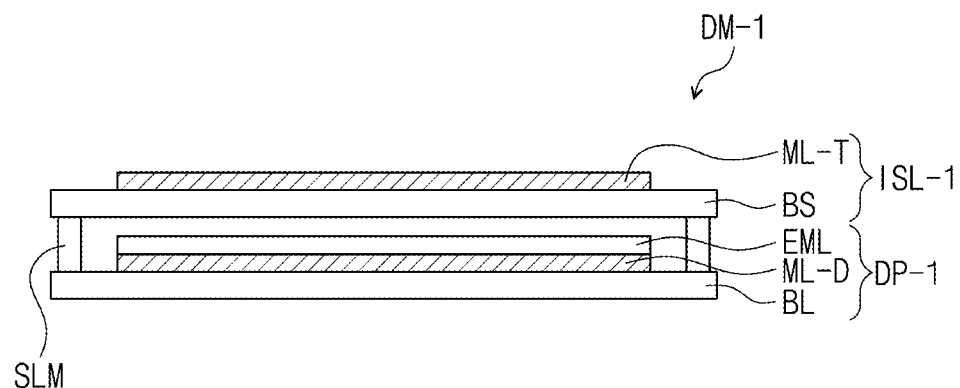
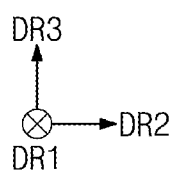

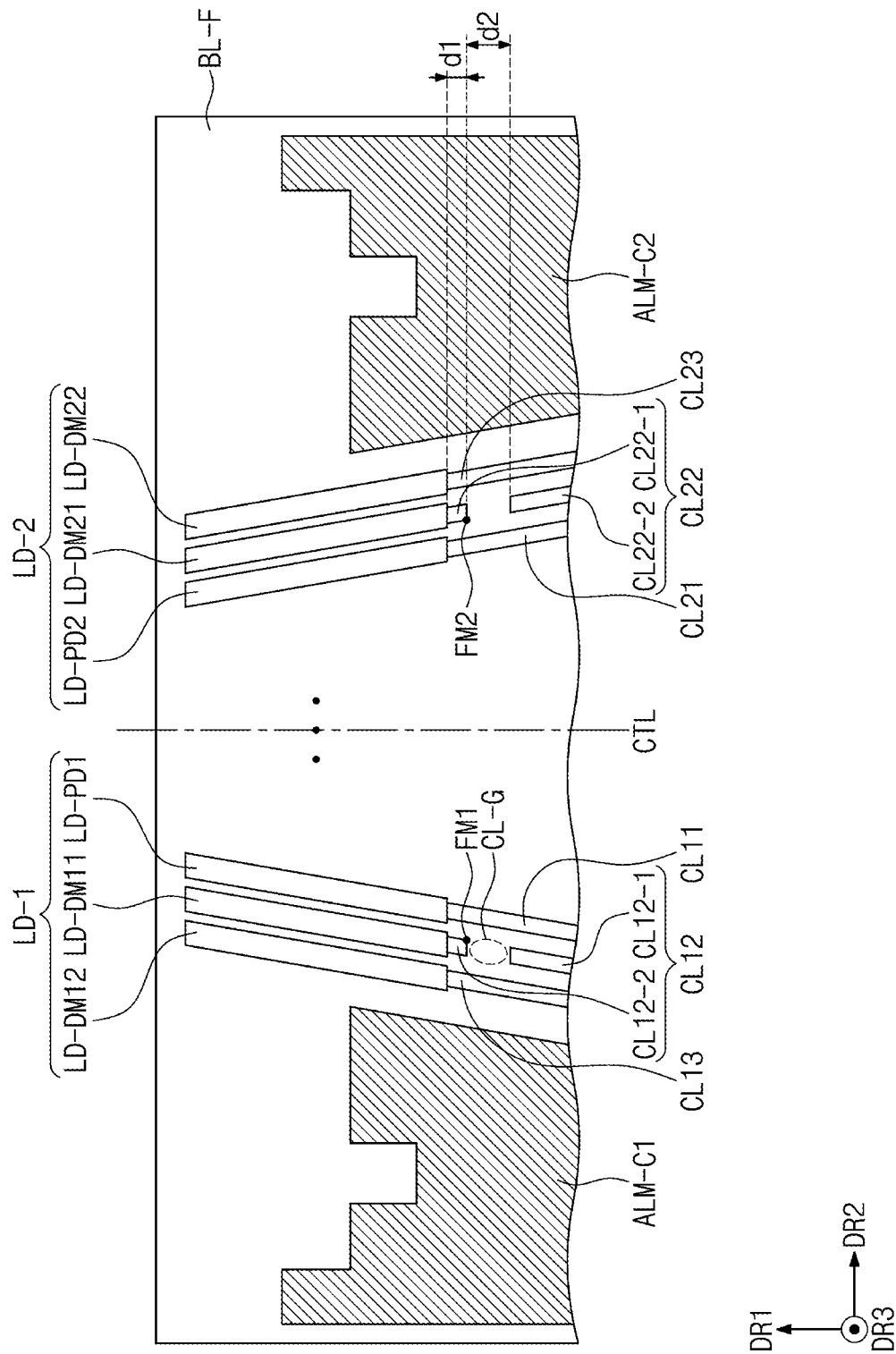

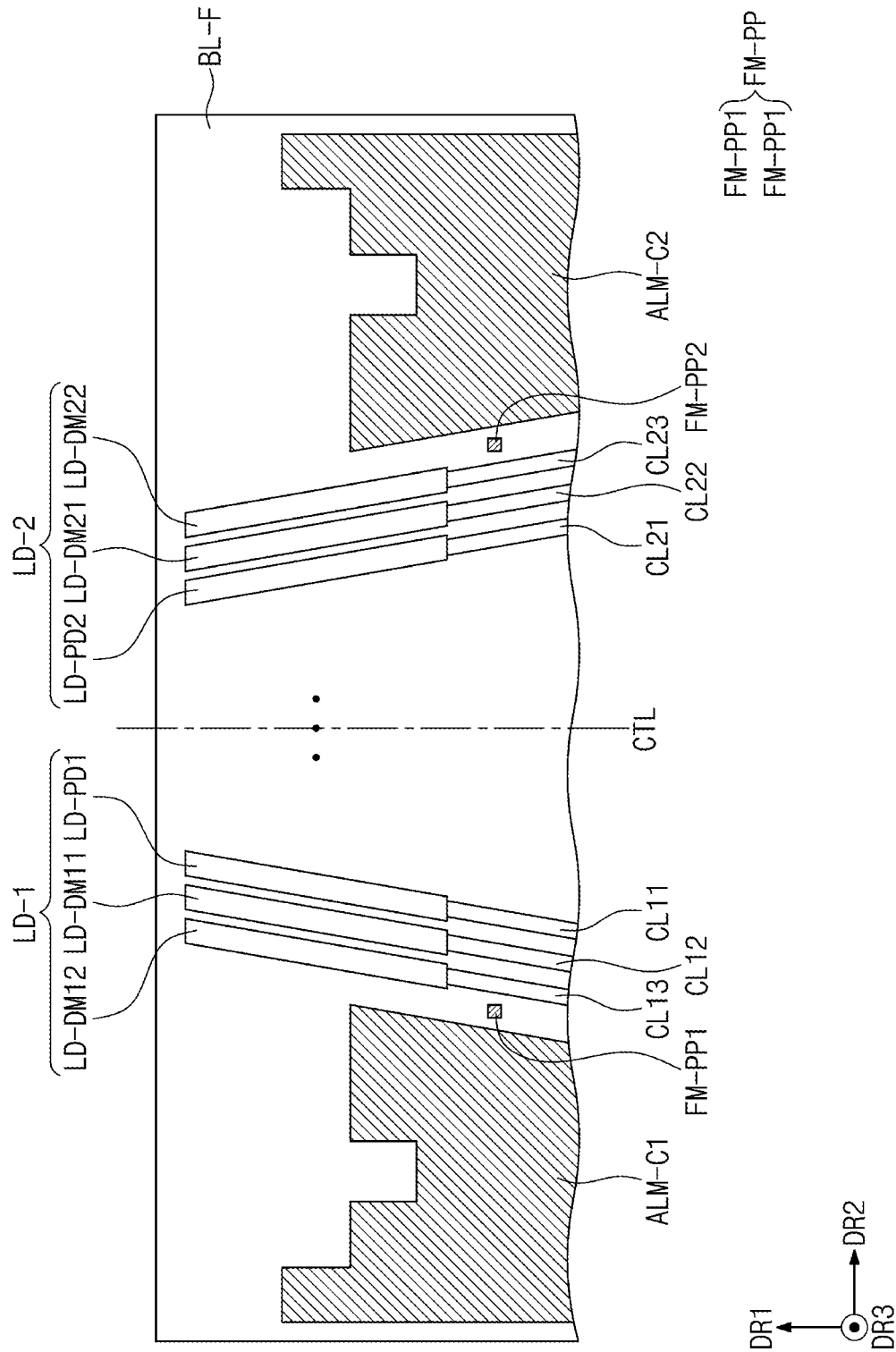

FIG. 10B
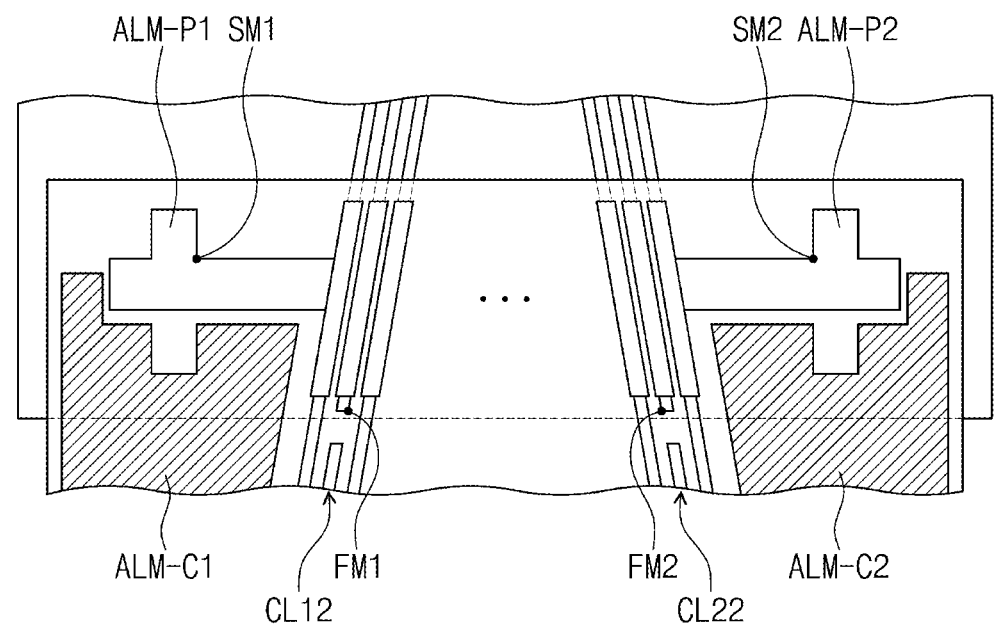
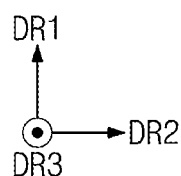

FIG. 14A
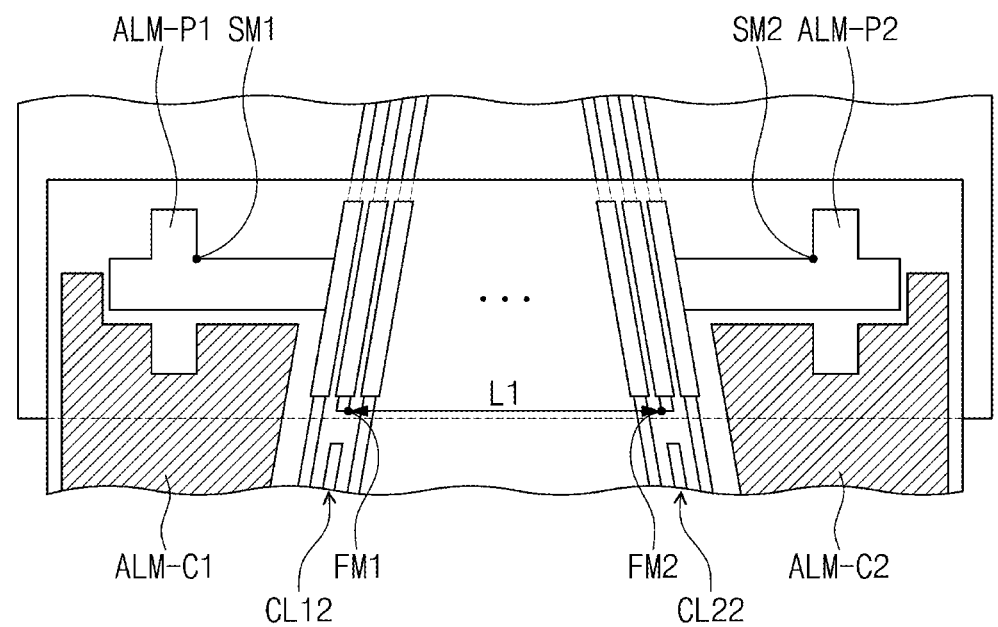
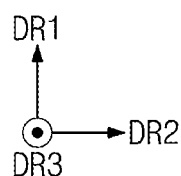

FIG. 14B
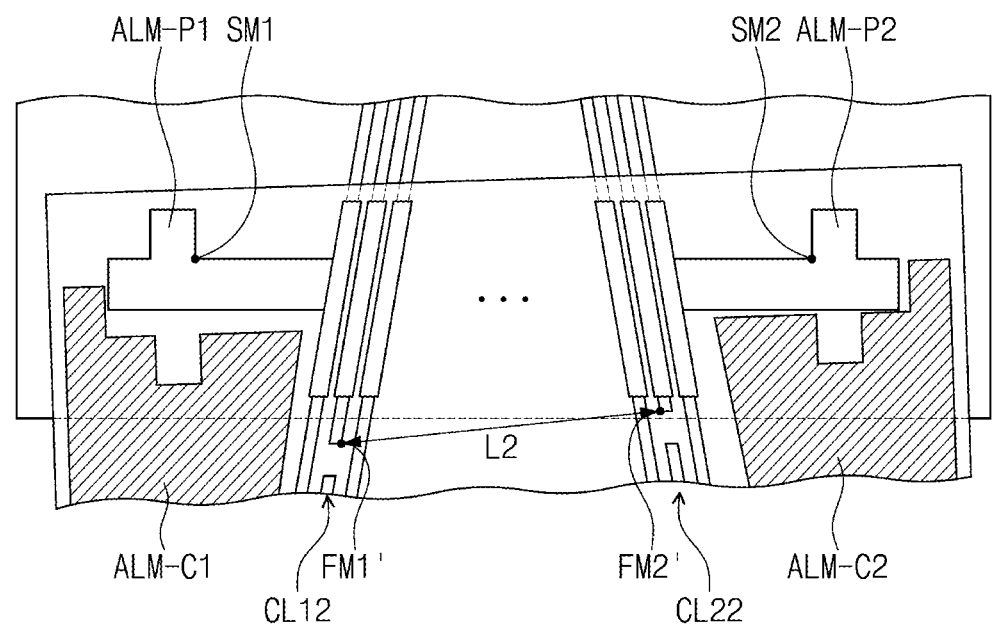
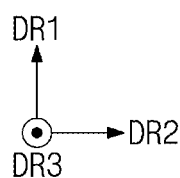

DISPLAY DEVICE AND METHOD FOR MANUFACTURING THE SAME

CROSS-REFERENCE TO RELATED APPLICATION

This application claims priority from and the benefit of Korean Patent Application No. 10-2020-0117625, filed on Sep. 14, 2020, which is hereby incorporated by reference for all purposes as if fully set forth herein.

BACKGROUND

Field

Embodiments of the invention relate generally to a display device and a method for manufacturing the same and, more particularly, to a display device in which the elongation rate of a flexible circuit board, which is generated in a process of bonding a display panel to the flexible circuit board, is measured to improve reliability.

Discussion of the Background

Display devices such as televisions, monitors, smart phones, and tablets that provide images to a user include display panels that display images. Various display panels such as liquid crystal display panels, organic light emitting display panels, electro wetting display panels, and electrophoretic display panels are currently being developed.

Recently, a display device including a flexible display panel has been developed. The display panel includes a plurality of pixels displaying an image and a driving circuit for driving the pixels. To realize a thin display device, pixels may be disposed on a display area of a display panel, and the flexible circuit board on which driving circuits are mounted may be connected to a non-display area of the display panel.

The above information disclosed in this Background section is only for understanding of the background of the inventive features to be described hereinbelow, and, therefore, it may contain information that does not constitute prior art.

SUMMARY

Applicant realized that controlling the rate of elongation of the flexible circuit board during the processing of bonding the flexible circuit board to the display panel can affect the reliability of the display device, Display devices having a flexible circuit board bonded to the display panel constructed according to the principles and illustrative implementations of the invention are capable of providing improved reliability by enabling the accurate measuring of the degree of elongation (i.e., elongation rate) of the flexible circuit board during bonding to the display device. For example, the elongation rate may be easily and accurately measured through at least one reference indicia provided with respect to at least one dummy circuit line on the flexible circuit board, to thereby improve reliability of the display device.

Methods for manufacturing a display device in accordance with the principles and exemplary implementations of the invention are capable of providing accurate measuring of the degree of elongation of a flexible circuit board in a process of bonding a display panel to the flexible circuit board.

Additional features of the inventive concepts will be set forth in the description that follows, and in part will be apparent from the description, or may be learned by practice of the inventive concepts.

More specifically, according to one embodiment, a display device includes: a display panel including a plurality of display pads at least some of which at least a portion extend in a first direction and are arranged in a second direction intersecting the first direction; and a flexible circuit board including a plurality of circuit pads, at least some of which are electrically connected to the plurality of display pads, and a plurality of circuit lines connected to the plurality of circuit pads, wherein the plurality of circuit pads include at least one dummy pad, and the plurality of circuit lines includes at least one dummy circuit line, at least a portion of which is connected to the dummy pad, wherein the dummy circuit line includes: a first portion connected to the dummy pad; and a second portion spaced apart from the first portion by a gap.

The display panel may further include a first indicia configured to overlap the plurality of display pads in the second direction.

The flexible circuit board may further include a second indicia at least a portion of which is configured to overlap the plurality of circuit pads in the second direction.

The plurality of circuit pads may further include a substrate pad configured to overlap the dummy pad in the second direction, wherein the plurality of display pads may include: a window pad or a panel dummy pad, which is electrically connected to the dummy pad; and input pads electrically connected to the substrate pad.

The first portion may have a length less than a distance between the first portion and the second portion.

The flexible circuit board may further include a circuit base layer on which the plurality of circuit pads and the circuit lines are disposed, and the circuit base layer may include a flexible material.

The dummy pad may include: a left dummy pad disposed at a left side of the flexible circuit board with respect to a central line of symmetry intersecting the flexible circuit board in the first direction; and a right dummy pad disposed at a right side of the flexible circuit board with respect to the central line, wherein the dummy circuit line may include: a left dummy circuit line including a first left portion connected to the left dummy pad and second left portion spaced apart from the first left portion by a first gap; and a right dummy circuit line including a first right portion connected to the right dummy pad and a second right portion spaced apart from the first right portion by a second gap.

An end of the first left portion and an end of the first right portion may not overlap each other in the second direction.

The flexible circuit board may further include a data driving circuit connected to at least a portion of the circuit lines.

The display device may further include a conductive adhesive film disposed between the display panel and the flexible circuit board to electrically connect the display pads to the substrate pads.

According to another embodiment, a display device includes: a display panel including a plurality of display pads at least some of which extend in a first direction and are arranged in a second direction intersecting the first direction; and a flexible circuit board electrically connected to the display panel, wherein the flexible circuit board includes: a plurality of circuit pads including substrate pads electrically connected to the plurality of display pads and at least one dummy pad disposed adjacent to the substrate pads; a plurality of circuit lines including a dummy circuit line connected to the dummy pad; a first indicia disposed adjacent to the plurality of circuit lines; and a reference point disposed on the dummy circuit line or disposed between the dummy circuit line and the first indicia.

The dummy circuit line may include: a first portion connected to the dummy pad; and a second portion spaced apart from the first portion by a gap, wherein the reference point may be defined on an end of the first portion.

The reference point may have a generally rectangular, generally circular, or generally triangular shape.

The reference point may include: a left reference mark disposed at a left side of the flexible circuit board with respect to a central line of symmetry intersecting the flexible circuit board in the first direction; and a right reference mark disposed at a right side of the flexible circuit board with respect to the central line of symmetry.

According to another embodiment, a method for manufacturing a display device includes: preparing a display panel having a display area configured to display an image, and a non-display area adjacent to the display area and including a plurality of display pads and a first indicia disposed on the non-display area; preparing a flexible circuit board including a plurality of circuit pads, a plurality of circuit lines connected to the plurality of circuit pads, a second indicia disposed adjacent to the plurality of circuit lines, and a plurality of reference points disposed on at least one of the plurality of circuit lines or disposed between two of the plurality of circuit lines and the second indicia; pressing the display panel and the flexible circuit board together so that at least a portion of the plurality of circuit pads is electrically connected to the plurality of display pads; and measuring a rate at which the flexible circuit board is elongated during the pressing of the flexible circuit board by measuring a distance between the plurality of reference points.

The step of pressing of the display panel and the flexible circuit board together may include: a first pressing process of pressing the display panel and the flexible circuit board at a first pressure; and a second pressing process of pressing the display panel and the flexible circuit board at a second pressure greater than the first pressure.

The step of measuring the elongation rate may include: measuring a first distance between the plurality of reference points before the second pressing process; measuring a second distance between the plurality of reference points after the second pressing process; and comparing the first distance with the second distance.

The reference point may include: a left reference mark disposed at a left side of the flexible circuit board with respect to a central line of symmetry; and a right reference mark disposed at a right side of the flexible circuit board with respect to the central line of symmetry, wherein the measuring the elongation rate includes measuring a distance between the left reference mark and the right reference mark.

The plurality of circuit pads may include at least one dummy pad, the plurality of circuit lines may include a dummy circuit line connected to the at least one dummy pad, and the dummy circuit line may include: a first portion connected to the at least one dummy pad, and a second portion spaced apart from the first portion by a gap.

The plurality of circuit pads may include at least one dummy pad, the plurality of circuit lines may include a dummy circuit line connected to the at least one dummy pad, the reference point may be disposed between the dummy circuit line and the second indicia, and the second indicia may have a generally rectangular, generally circular, or generally triangular shape.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate illustrative embodiments of the invention, and together with the description serve to explain the inventive concepts.

FIG. 3A is a cross-sectional view of one embodiment of the display module of FIG. 1.

FIG. 3B is a cross-sectional view of another embodiment of the display module of FIG. 1.

FIGS. 7A and 7B are enlarged plan views illustrating a partial area of a flexible circuit board of FIG. 6.

FIGS. 10A and 10B are plan views illustrating the display panel and the flexible circuit board bonded to each other on the area AA of FIG. 6.

FIGS. 14A and 14B are plan views illustrating an embodiment of partial measuring processes of the method for manufacturing the display device.

DETAILED DESCRIPTION

Figure 1:
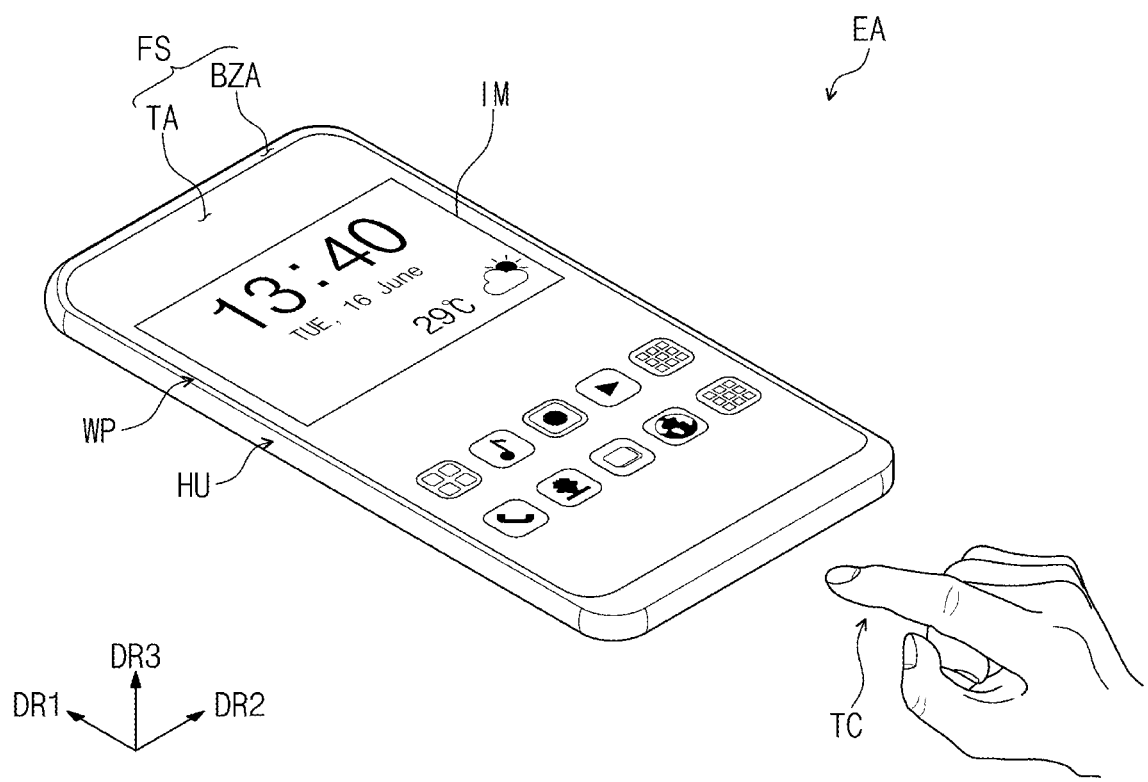
FIG. 1 is a front perspective view of an embodiment of a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, wellknown structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive features may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
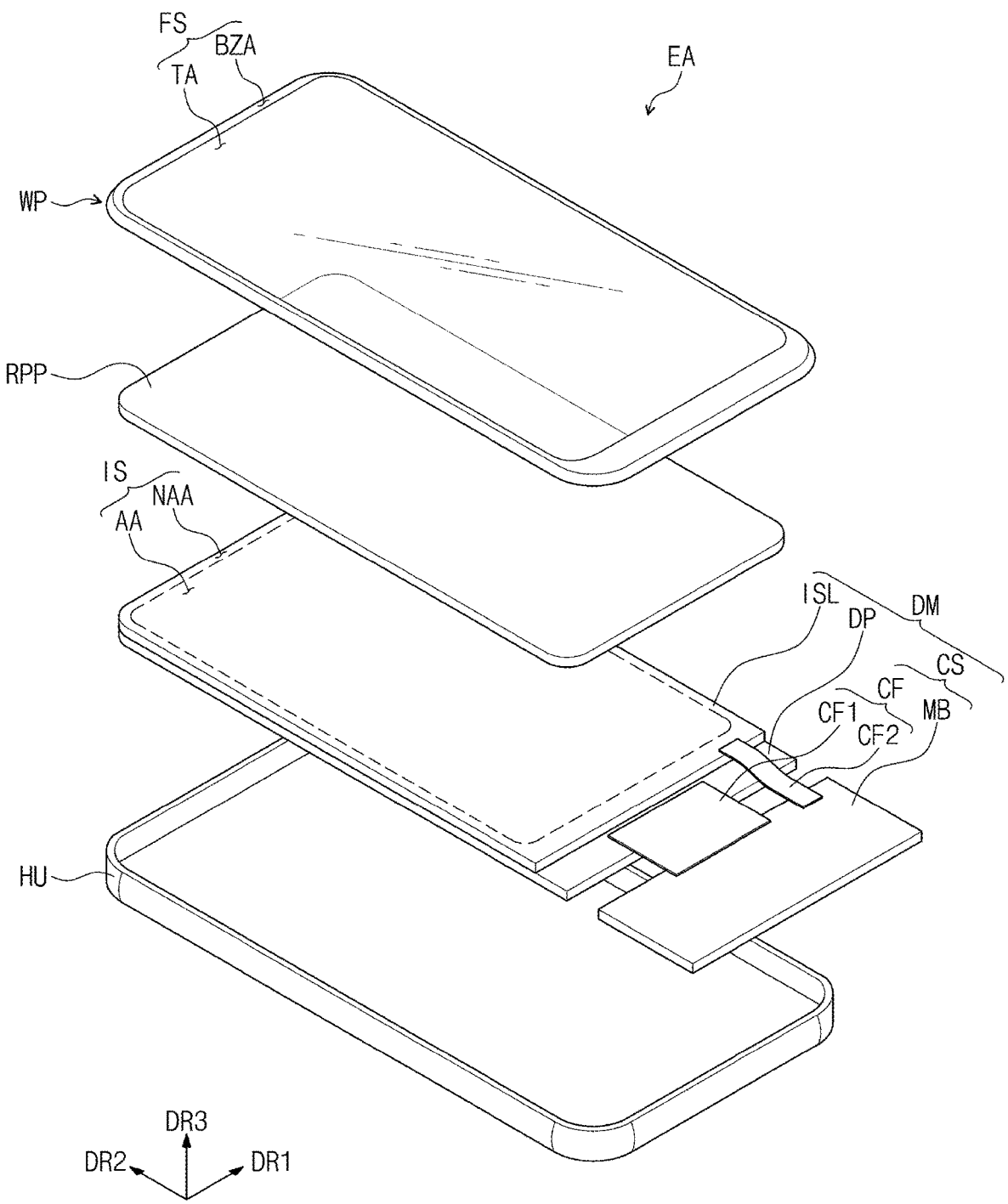
FIG. 2 is an exploded perspective view of the display device of FIG. 1.

FIG. 1 is a front perspective view of an embodiment of a display apparatus constructed according principles of the invention. FIG. 2 is an exploded perspective view of the display device according to an embodiment.

Referring to FIGS. 1 and 2, a display device EA may be a device that is activated according to an electrical signal. The display device EA may be realized through various embodiments. For example, the display device EA may be used for large electronic devices such as a television, a monitor, or an external billboard as well as small and medium-sized electronic devices such as a personal computer, a notebook computer, a personal digital terminal, a car navigation unit, a game console, a portable electronic device, and a camera. Also, the above-described devices are described as merely an embodiment, and thus, the display device EA may be adopted for other electronic equipment unless departing from the scope of the invention. In this embodiment, the display device EA as part of a smart phone will be described as an example.

The display device EA may display an image IM in the third direction DR3 on a display surface FS substantially parallel to each of the first and second directions DR1 and DR2. The image IM may include a still image as well as a dynamic image such as a video image that changes over time. In FIG. 1, the image IM is shown as a time display window and icons as an example. A display surface FS on which the image IM is displayed may correspond to a front surface of the display device EA and also correspond to a front surface of a window WP.

In this embodiment, a front surface (or a top surface) or a rear surface (or a bottom surface) of each of members may be defined based on a direction in which the image IM is displayed. The front and rear surfaces may face each other in a third direction DR3. The normal direction to each of the front and rear surfaces may be substantially parallel to the third direction DR3. The directions indicated as the first to third directions DR1, DR2, and DR3 may be a relative concept and thus changed into different directions. In this specification, the term "in plan" may signify when viewed in the third direction DR3.

The display device EA may include a window panel WP, an antireflection panel RPP, a display module DM, and a housing HU. In this embodiment, the window panel WP and the housing HU are coupled to each other to define an outer appearance of the display device EA.

The window panel WP may include an optically transparent insulation material. For example, the window panel WP may include glass or plastic. The window panel WP may have a single-layered structure or a multilayered structure. For example, the window panel WP may include a plurality of plastic films bonded to each other by using an adhesive or include a glass substrate and a plastic film, which are bonded to each other by using an adhesive.

A front surface FS of the window panel WP may define the front surface of the display device EA as described above. The transmission area TA may be an optically transparent area. For example, the transmission area TA may be an area having a visible light transmittance of about 90% or more.

The bezel area BZA may be an area HA having light transmittance that is relatively less than that of the transmission area TA. The bezel area BZA defines a shape of the transmission area TA. The bezel area BZA may be disposed adjacent to the transmission area TA to surround the transmission area TA.

The bezel area BZA may have a predetermined color. The bezel area BZA may cover a peripheral area NAA of the display module DM to prevent the peripheral area NAA from being visible from the outside. However, this is merely an example. For example, the bezel area BZA is optional and may be omitted.

The antireflection panel RPP may be disposed below the window panel WP. The antireflection panel RPP reduces reflectance of external light incident from an upper side of the window panel WP. The antireflection panel RPP is optional and may be omitted or may be provided as a component included in the display module DM.

The display module DM may display the image IM and sense an external input TC. The external input TC may include various types of inputs externally provided to the display module DM (e.g., an input provided via an operator's finger). The external input TC may be provided in various forms.

For example, the external input TC may include an external input such as hovering (proximity to or adjacent by a predetermined distance to the display module DM) or contacting a portion of the human body such as user's hands. Also, the input may be provided in various other forms such as force, a pressure, light, and the like and is not limited to any one embodiment. FIG. 1 illustrates the user's hand as an example of the external input TC.

The display module DM includes a front surface IS including an active area AA and a peripheral area NAA. The active area AA may be an area that is activated according to an electrical signal.

In this embodiment, the active area AA may be an area on which the image IM is displayed, and also, the external input is sensed. The transmission area TA overlaps at least active region AA. For example, the transmission area TA overlaps an entire surface of at least a portion of the active region AA. Thus, a user may see the image IM or provide the external input TC through the transmission area TA. However, this is merely an example. For example, an area of the active area AA, on which the image IM is displayed, and an area of the active area AA, on which the external input is sensed, may be separated from each other, but is not limited to a specific embodiment.

The peripheral region NAA may be an area covered by the bezel area BZA. The peripheral region NAA is adjacent to the active region AA. The peripheral region NAA may surround the active region AA. A driving circuit or a driving line for driving the active region AA may be disposed in the peripheral region NAA.

The display module DM includes a display panel DP, an input sensing unit ISL, and a circuit board CS.

The display panel DP may be a component that substantially generates the image IM. The image IM generated by the display panel DP may be visible from the outside by the user through the transmission area TA.

The input sensing unit ISL senses an external input applied from the outside. As described above, the input sensing unit ISL may sense the external input provided to the window panel WP.

The circuit board CS is electrically connected to the display panel DP. The circuit board CS includes a main circuit board MB and a flexible circuit board CF. The flexible circuit board CF may include a panel circuit board CF1 and an input circuit board CF2.

The panel circuit board CF1 is electrically connected to the display panel DP. The panel circuit board CF1 may connect the display panel DP to the main circuit board MB. In this embodiment, the panel circuit board CF1 is illustrated as a flexible circuit film to which the main circuit board MB is connected at an end thereof. However, this is merely an example, and the panel circuit board CF1 may not be connected to the main circuit board MB.

The panel circuit board CF1 may be connected to pads (display pads) of the display panel DP disposed on the peripheral area NAA. The panel circuit board CF1 provides an electrical signal for driving the display panel DP to the display panel DP. The electrical signal may be generated in the panel circuit board CF1 or generated in the main circuit board MB.

The circuit board CS may further include an input circuit board CF2 electrically connected to the input sensing unit ISL. The input circuit board CF2 may connect the input sensing unit ISL to the main circuit board MB. In this embodiment, the input circuit board CF2 may be provided as a flexible circuit film to connect the input sensing unit ISL to the main circuit board MB. However, this embodiment is not limited thereto, and the input circuit board may not be connected to the main circuit board MB.

The input circuit board CF2 may be connected to pads (sensing pads) of the input sensing unit ISL disposed on the peripheral area NAA. The input circuit board CF2 provides an electrical signal for driving the input sensing unit ISL to the input sensing unit ISL. The electrical signal may be generated in the input circuit board CF2 or generated in the main circuit board MB.

The main circuit board MB may include various driving circuits for driving the display module DM and a connector for supplying power. Each of the panel circuit board CF1 and the input circuit board CF2 may be connected to the main circuit board MCB. According to one feature, the display module DM may be easily controlled through one main circuit board MB. However, this is merely an example. In the display module, the display panel DP and the input sensing unit ISL may be respectively connected to different main boards, or one of the panel circuit board CF1 and the input circuit board CF2 may not be connected to one main circuit board MB, but the embodiments are not limited to a specific configuration.

The housing HU is coupled to the window panel WP. The housing HU is coupled to the window panel WP to provide a predetermined internal space. The display module DM may be accommodated in the internal space.

The housing HU may include a material having relatively high rigidity. For example, the housing HU may include glass, plastic, or a metal or may include a plurality of frames and/or plates made of a combination of glass, plastic, and a metal. The housing HU may stably protect the components of the display device EA, which are accommodated in the internal space, against an external impact.

FIGS. 3A and 3B are cross-sectional views of the display device according to an embodiment.

Referring to FIG. 3A, the display module DM may include a display panel DP, an input sensing unit ISL, and a coupling member SLM.

The display panel DP may be an emission type display panel, but the embodiments are not limited thereto. For example, the display panel DP may be an organic light emitting display panel and a quantum-dot light emitting display panel.

The display panel DP may include a base substrate BL, a display circuit layer ML-D, and a light emitting layer EML. The input sensing unit ISL may include an upper substrate BS2 and a sensing circuit layer ML-T.

Each of the base substrate BL and the upper substrate BS may be a silicon substrate, a plastic substrate, a glass substrate, an insulation film, or a laminate structure including a plurality of insulating layers. The base substrate BL may be a display substrate on which a circuit layer, a display layer, and the like are disposed.

The display circuit layer ML-D may be disposed on the base layer BL. The display circuit layer ML-D may include a plurality of insulating layers, a plurality of conductive layers, and a semiconductor layer. A plurality of conductive layers of the display circuit layer ML-D may constitute signal lines or a control circuit of a pixel.

The light emitting layer EML may be disposed on the display circuit layer ML-D. The light emitting layer EML may be a layer that generates light or controls transmittance of light. For example, the light emitting layer EML of the organic light emitting display panel may include an organic light emitting material. The light emitting layer EML of the quantum dot light emitting display panel may include at least one of a quantum dot, a quantum rod, or the like. The light emitting layer EML of the liquid crystal display panel may include a liquid crystal layer.

The upper substrate BS may be disposed on the light emitting layer EML. The upper substrate BS may be an encapsulation substrate that encapsulates the display panel DP. A predetermined space may be defined between the upper substrate BS and the light emitting layer EML. The space defined between the upper substrate BS and the light emitting layer EML may be filled with air or an inert gas. Additionally, the space defined between the upper substrate BS and the light emitting layer EML may be filled with a filler such as a silicone-based polymer, an epoxy-based resin, or an acrylic-based resin. However, the embodiments of the invention are not limited thereto. For example, a space may not be provided between the light emitting layer EML and the upper substrate BS, and as such the light emitting layer EML and the upper substrate BS may be in contact with each other.

The sensing circuit layer ML-T may be disposed on the upper substrate BS. The sensing circuit layer ML-T may include a plurality of insulating layers and a plurality of conductive layers. The plurality of conductive layers constitute a sensing electrode that senses the external input, a sensing line connected to the sensing electrode, and a sensing pad connected to the sensing line.

The coupling member SLM may be disposed between the base substrate BL and the upper substrate BS. The coupling member SLM couples the base layer BL to the upper substrate BS. The coupling member SLM may include an organic material such as a photocurable resin or a photoplastic resin or may include an inorganic material such as a frit seal, but is not limited to a specific embodiment.

FIG. 3B is a cross-sectional view of the display device according to an embodiment.

Referring to FIG. 3B, a display module DM-1 may include a display panel DP-1 and an input sensing unit ISL-1. The input sensing unit ISL-1 may be referred to as an input sensing layer.

The display panel DP may include the base substrate BL, a display circuit layer ML-D, a light emitting layer EML, and a thin film encapsulation layer TFL. The input sensing unit ISL-1 may include a base layer TFL and a sensing circuit layer ML-T. The thin film encapsulation layer TFL and the base layer TFL may be the same configuration.

The display panel DP-1 and the input sensing unit ISL-1 may be formed through a continuous process. That is, the sensing circuit layer ML-T may be directly disposed on the thin film encapsulation layer TFL.

Figure 4:
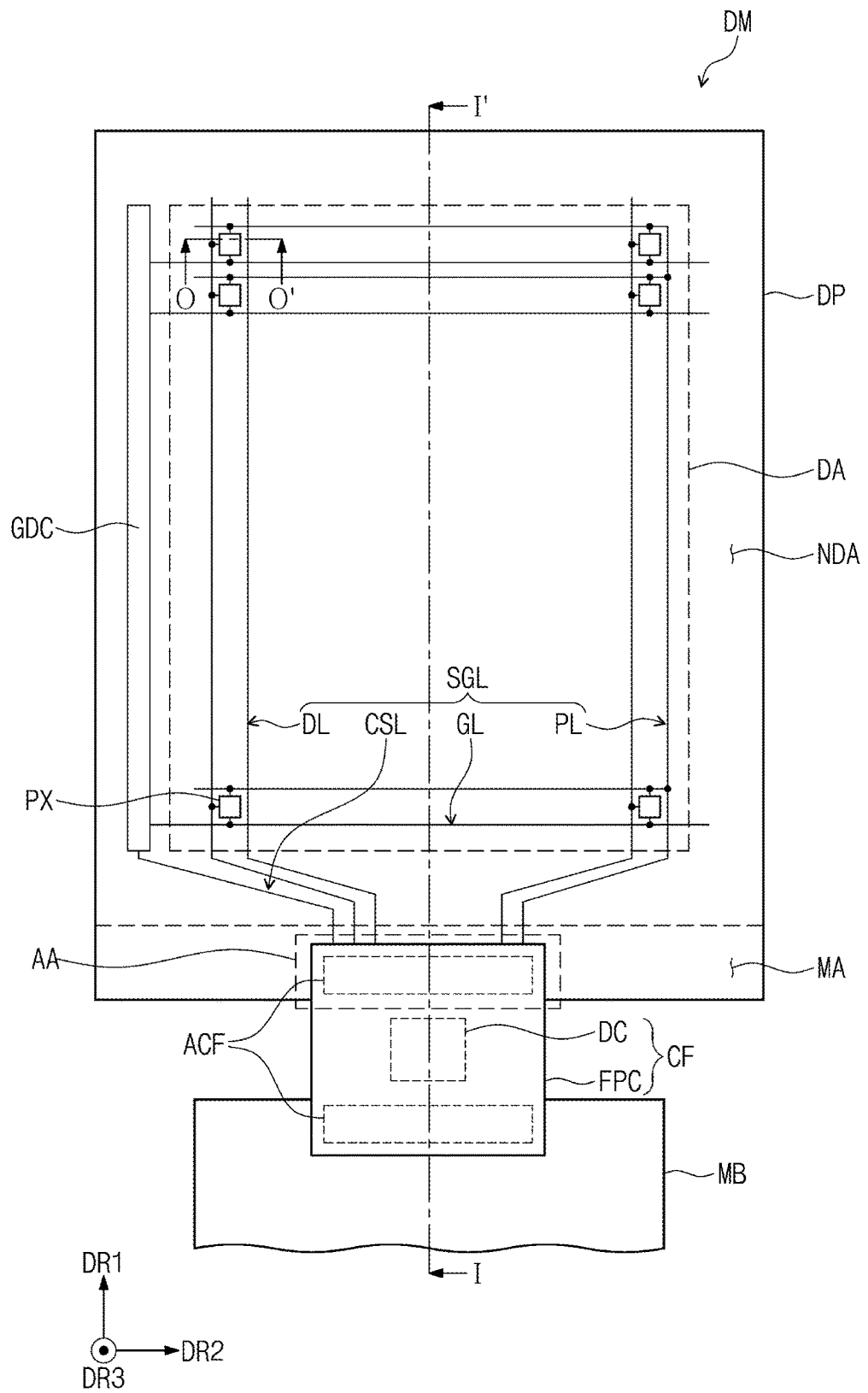
FIG. 4 is a plan view of the display device of FIG. 1.
Figure 5A:
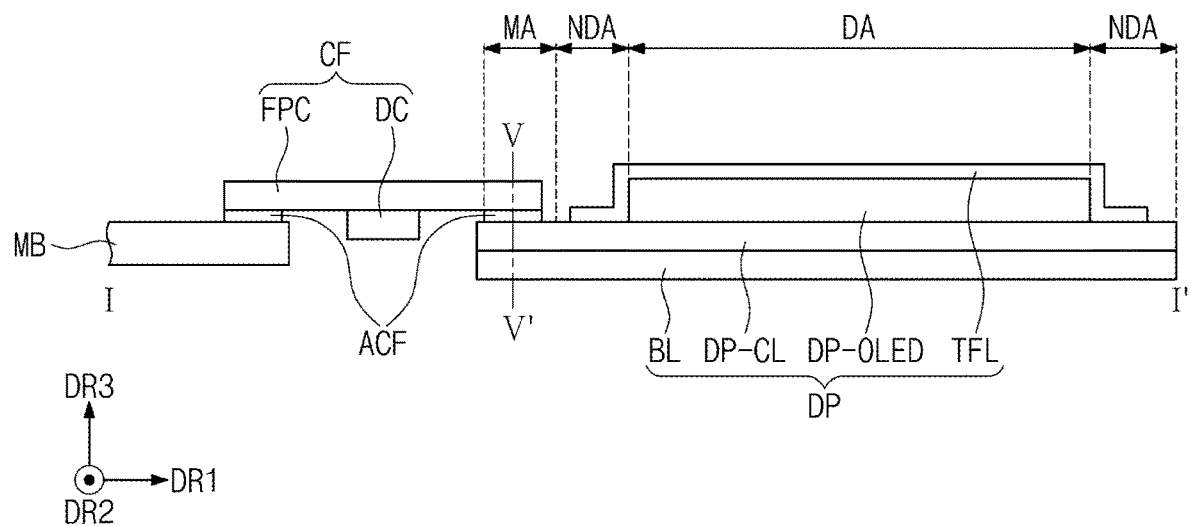
FIG. 5A is a cross-sectional view of the display device taken along line I-I' of FIG. 4.

FIG. 4 is a plan view of a display device according to an embodiment. FIG. 5A is a cross-sectional view of the display device according to an embodiment. FIG. 5A is a cross-sectional view taken along line I-I' of FIG. 4.

Referring to FIGS. 4 and 5A, the display module DM may include a display panel DP, a flexible circuit board CF, and a conductive adhesive film ACF. The display module DM may include a main circuit board MB electrically connected to the flexible circuit board CF through the conductive adhesive film ACF. In this embodiment, the flexible circuit board CF may include a flexible circuit board part FPC and a data driving circuit DC.

A non-display area NDA adjacent to the display area DA on which a pixel PX is disposed may be defined on the display panel DP. A pad area PA (FIG. 6) on which a pad electrode to be described later is disposed may be defined on the non-display area NDA. In an embodiment, a mounting area MA may be defined on the display panel DP. The flexible circuit board CF may be bonded to the mounting area MA by a conductive adhesive film ACF. The non-display area NDA and the mounting area MA may not be distinguished from each other. The mounting area MA may be a portion of the non-display area NDA. The pad area PA may be defined on a portion of the mounting area MA. A detailed description of the pad area PA is provided below As illustrated in FIG. 4, the display panel DP may display a desired image by applying a driving signal to a plurality of pixels PX. The plurality of pixels PX may be disposed in a matrix form along first and second directional axes DR1 and DR2, which are perpendicular to each other. The pixels PX may include first to third pixels that respectively display a red color, a green color, and a blue color. In an embodiment, the pixels PX may further include a portion of pixels that respectively display white, cyan, and magenta.

Each of the pixels PX includes an organic light emitting diode and a driving circuit GDC connected to the organic light emitting diode. The gate driving circuit GDC and the signal lines SGL may be provided in the circuit element layer DP-CL illustrated in FIG. 2.

The driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described below. The scan driving circuit may further output other control signals to the driving circuit of each of the pixels PX.

The scan driving unit may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL includes scan lines GL, data lines DL, a power line PL, and a control signal line CSL. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

Figure 6:
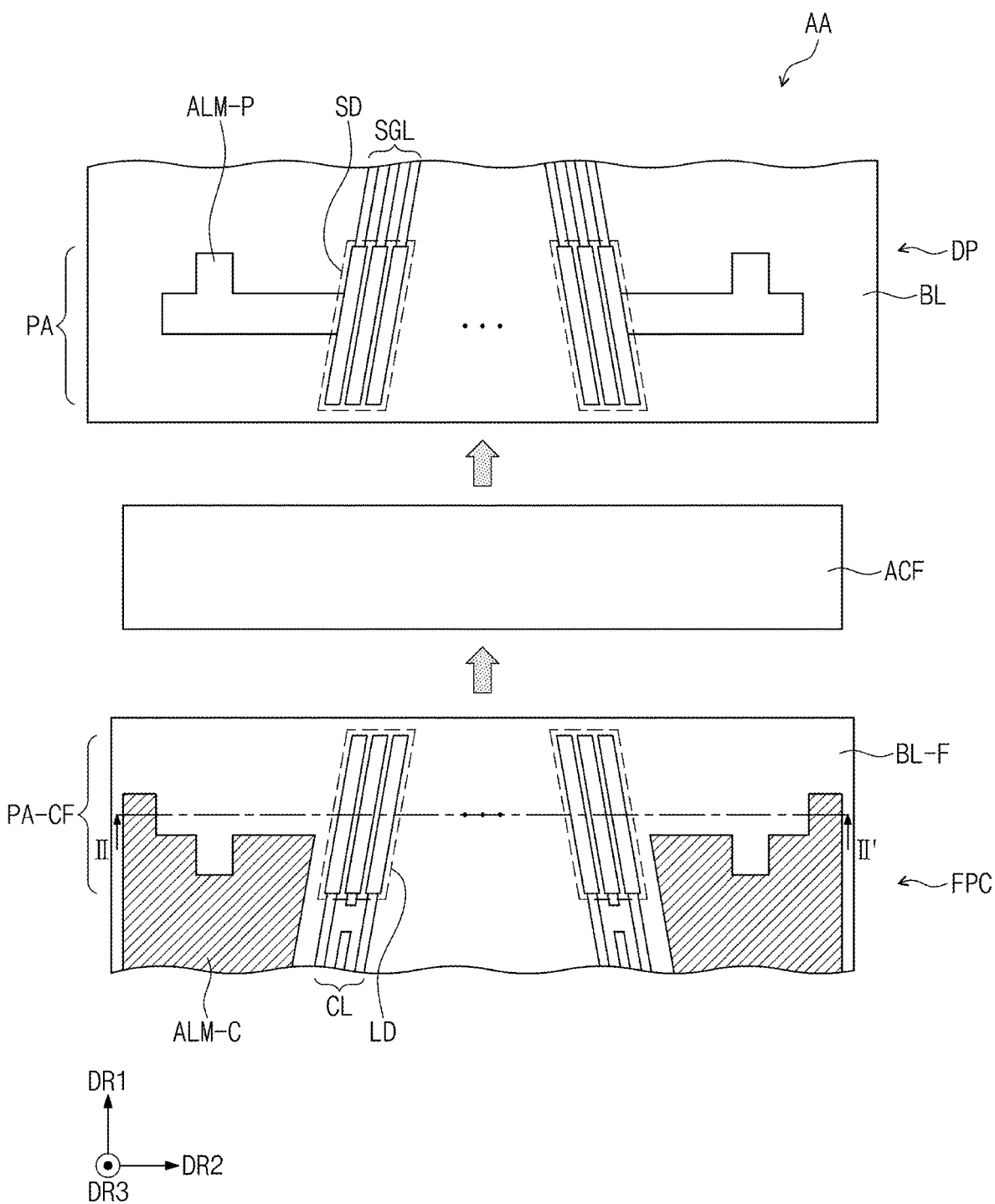
FIG. 6 is an enlarged and exploded plan view of area AA' of FIG. 4.

The signal lines SGL overlap the display area DA and the non-display area NDA. The signal lines SGL may include a pad part and a line part. The line part overlaps the display area DA and the non-display area NDA. The pad part is connected to an end of the line part. The pad part is disposed on the non-display area NDA to overlap a corresponding signal pad of the signal pads. An area, on which the signal pads are disposed on the non-display area NDA may be defined as a pad area PA (FIG. 6). This will be described hereinbelow in greater detail.

The display panel DP may be classified into a liquid crystal display panel, an organic electroluminescent display panel, an electrowetting display panel, a quantum dot emission display panel, and the like according to type of the plurality of pixels PX. In this embodiment, the display panel DP may be an organic electroluminescent display panel.

As illustrated in FIG. 5A, the display panel DP includes a base substrate BL, a circuit element layer DP-CL disposed on the base substrate BL, a display element layer DP-OLED, and an encapsulation layer TFL. In this specification, the phrase that "region/portion and area/portion corresponds to each other" means "overlapping each other" in the direction D3, but is not limited to having the same area and/or the same shape unless otherwise stated.

The base layer BL may include at least one synthetic resin film. The base substrate BL may include a glass substrate, a metal substrate, and an organic/inorganic composite substrate.

The circuit element layer DP-CL includes at least one insulating layer and a circuit element. The insulating layer includes at least one inorganic layer and at least one organic layer. The circuit element includes signal lines and pixel driving circuits.

The display element layer DP-OLED may include at least organic light emitting diodes as light emitting elements. The display element layer DP-OLED may further include an organic layer such as a pixel defining layer.

The encapsulation layer TFL may include a plurality of thin films. One portion of the thin films may improve optical efficiency, and the other portion of the thin film may protect the organic light emitting diodes.

A black matrix that blocks light may be disposed on the non-display area NDA. A driving circuit GDC for supplying a gate signal to the plurality of pixels PX may be disposed on the non-display area NDAA data driving circuit may be further disposed on the non-display area NDA. A pad area PA (FIG. 6) for receiving a signal supplied from the flexible circuit board CF may be defined on the mounting area MA.

As illustrated in FIGS. 4 and 5A, the flexible circuit board CF includes a flexible circuit board part FPC and a data driving circuit DC. The data driving circuit DC may include at least one driving chip. The data driving circuit DC is electrically connected to lines of the flexible circuit board part FPC.

When the flexible circuit board CF includes the data driving circuit DC, a pad part of the display panel DP may include data pads electrically connected data lines and control signal pads electrically connected to the control signal pads. The data lines may be connected to the pixels PX, and the control signal lines may be connected to the driving circuit GDC. Although the flexible circuit board CF has a chip on film structure, the embodiments are not limited thereto.

The main circuit board MB provides image data, a control signal, and a power voltage to the display panel DP or the data driving circuit DC. The main circuit board MB may be a board having a greater area than the flexible circuit board part FPC and may include active elements and passive elements. The main circuit board MB may be a flexible board or a rigid board and may include a pad part connected to the flexible circuit board part FPC.

Figure 5B:
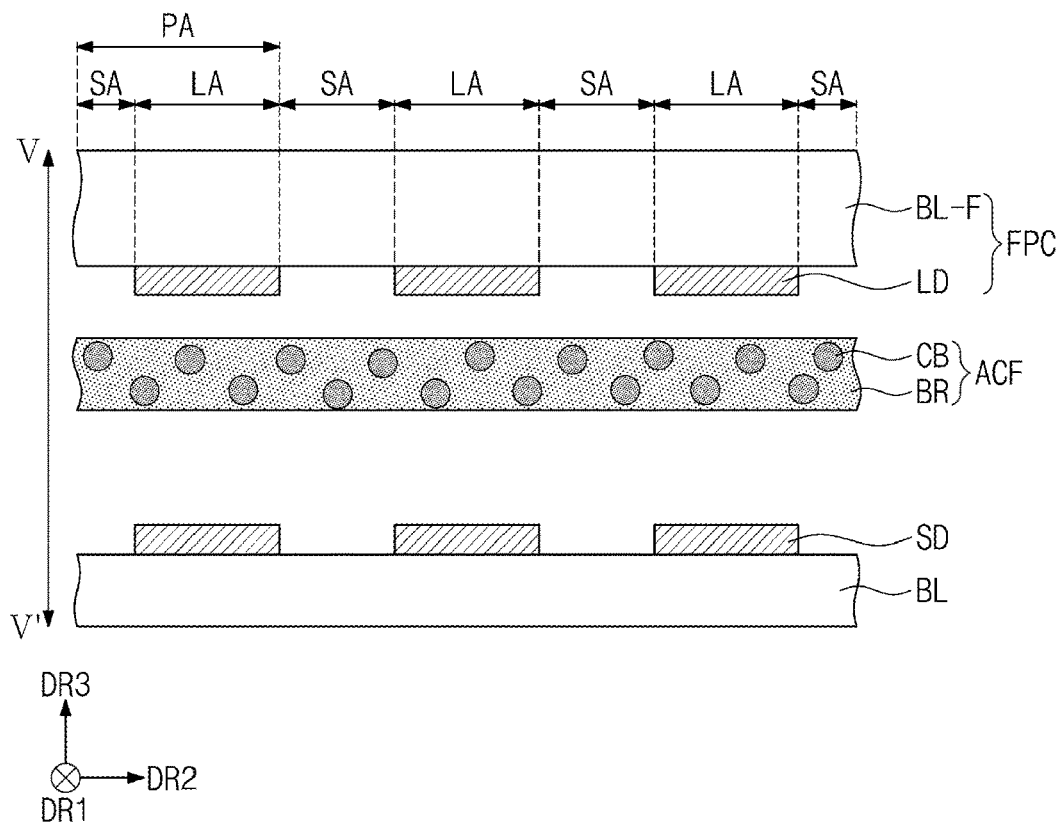
FIG. 5B is a partial, enlarged cross-sectional view of the display device taken along line V-V' of FIG. 5A.

FIG. 5B is a partial cross-sectional view of the display device according to an embodiment. FIG. 5B is an exploded cross-sectional view taken along line V-V' of FIG. 5A.

Referring to FIGS. 5A and 5B, the flexible circuit board CF may include a plurality of substrate pads LD. The flexible circuit board part FPC may include a circuit base layer BL-F and a plurality of substrate pads LD disposed on the circuit base layer BL-F. Each of the plurality of substrate pads LD may be spaced a predetermined distance from each other. The circuit base layer BL-F provides a base surface of the flexible circuit board CF disposed on the display panel DP. The circuit base layer BL-F may include a flexible material. For example, the circuit base layer BL-F may be a polyimide film having flexible properties.

The plurality of substrate pads LD may be in direct contact with the pad area PA (FIG. 6) of the display panel DP. Particularly, the plurality of substrate pads LD may be in contact with the display pads SD provided in the circuit element layer of the display panel. As the plurality of substrate pads LD and the display pads SD are connected to each other, the flexible circuit board CF and the display panel DP may be electrically connected to each other.

The conductive adhesive film ACF may be disposed between the flexible circuit board CF and the display panel DP. The conductive adhesive film ACF may be disposed between the flexible circuit board CF and the circuit element layer DP-CL on the pad area PA. The conductive adhesive film ACF may include a plurality of conductive balls CB that electrically connect the flexible circuit board CF to the display panel DP. The conductive adhesive film ACF may further include an adhesive resin BR in which a plurality of conductive balls CB are dispersed. The plurality of conductive balls CB may be aligned in the second direction DR2 when the display panel DP and the flexible circuit board CF are electrically connected to each other.

Figure 5C:
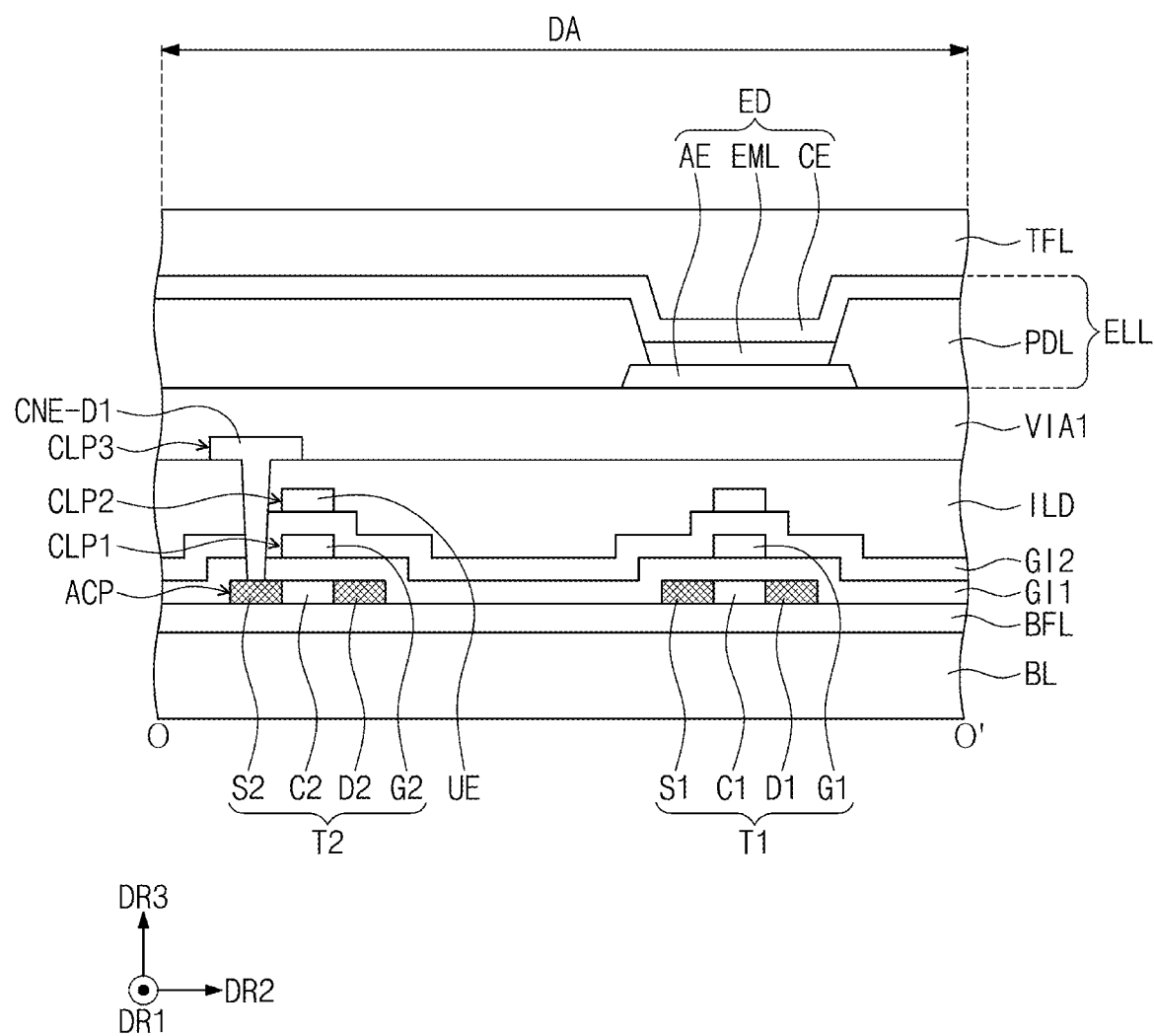
FIG. 5C is a cross-sectional view of the display panel taken along line O-O' of FIG. 4.

FIG. 5C is a cross-sectional view of a display panel according to an embodiment. FIG. 5C is a cross-sectional view taken along line O-O' of FIG. 4.

FIG. 5C is a cross-sectional view of a display area DA of a display panel DP. Referring to FIG. 5C, the display panel DP includes a buffer layer BFL, a first gate insulating layer GI1, a second gate insulating layer GI2, an interlayer insulating layer ILD, an upper insulating layer VIA1, a semiconductor pattern ACP including a plurality of patterns, a first conductive layer CLP1 including a plurality of patterns, a second conductive layer CLP2 including a plurality of patterns, and a third conductive layer CLP3 including a plurality of patterns. Here, the first conductive layer CLP1 may include a first gate metal pattern, the second conductive layer CLP2 may include a second gate metal pattern, and the third conductive layer CLP3 may include a first data metal pattern.

Each of the first gate insulating layer GI1, the second gate insulating layer GI2, and the interlayer insulating layer ILD may include an organic layer and/or an inorganic layer. Each of the first gate insulating layer GI1, the second gate insulating layer GI2, and the first insulating layer ILD1 may include a plurality of inorganic thin films. The plurality of inorganic thin films may include a silicon nitride layer and a silicon oxide layer. Each of the first conductive layer CLP1 and the second conductive layer CLP2 may include molybdenum (Mo), but is not limited thereto.

The third conductive layer CLP3 may include at least one of aluminum (Al) or titanium (Ti), but is not limited thereto. The third conductive layer CLP3 may have a structure in which titanium, aluminum, and titanium are sequentially stacked.

The buffer layer BFL may be disposed on the base substrate BL. The buffer layer BFL may include a first buffer layer and a second buffer layer. The second buffer layer may be disposed on the first buffer layer. The buffer layer BFL prevents impurities existing on the base substrate BS from being introduced into the pixel PX during the manufacturing process. Particularly, the buffer layer BF prevents the impurities from being diffused into the semiconductor pattern ACP of transistors T1 and T2 constituting the pixel PX.

The impurities may be introduced from the outside or generated while the base substrate BL is pyrolyzed. The impurities may be a gas or sodium discharged from the base substrate BL. Also, the buffer layer BFL may block moisture introduced from the outside into the pixel PX.

The semiconductor pattern ACP may be disposed on the buffer layer BFL. The semiconductor pattern ACP may be disposed on the buffer layer BFL.

The semiconductor pattern ACP may include each of the transistors T1 to T2. The semiconductor pattern ACP may include polysilicon, amorphous silicon, or a metal oxide semiconductor. FIG. 5C illustrates a semiconductor pattern constituting a source S1, an active C1, and a drain D1 of the first transistor T1 and a semiconductor pattern constituting a source S2, an active C2, and a drain D2 of the second transistor T2.

The first gate insulating layer G1 may be disposed on the buffer layer BFL to cover the semiconductor pattern ACP. The first conductive layer CLP1 may be disposed on the first gate insulating layer GI1. The gate G1 of the first transistor T1 and the gate G2 of the second transistor T2 are illustrated in the first conductive layer CLP1. The first conductive layer CLP1 may include one of two electrodes constituting the capacitor of the pixel PX.

The second gate insulating layer GI2 may be disposed on the first gate insulating layer GI1 to cover the first conductive layer CLP1. The second conductive layer CLP2 may be disposed on the second gate insulating layer GI2. The second conductive layer CLP2 may be the other of the two electrodes constituting the capacitor CP of the pixel PX. An upper electrode UE is illustrated as the second conductive layer CLP2. An opening UE-OP may be defined in the upper electrode UE.

The interlayer insulating layer ILD may be disposed on the second gate insulating layer GI2 to cover the second conductive layer CLP2. The first connection electrodes CNE-D1 of the first conductive layer CLP1 may be connected to the gate G1 of the first transistor T1 and the source S2 of the second transistor T2, respectively. The upper insulating layer VIA1 may be disposed on the interlayer insulating layer ILD to cover the third conductive layer CLP3.

In FIG. 5C, in the display area DA, a light emitting element layer ELL may include a light emitting element ED and a pixel defining layer PDL. The light emitting element ED may include an anode electrode AE, a light emitting layer EML, and a cathode electrode CE. The pixel defining layer PDL may correspond to a pixel defining film. The anode electrode AE may be disposed on the anode layer AEL.

The anode electrode AE may be disposed on the upper insulating layer VIA1. The anode electrode AE may be electrically connected to the third conductive layer CLP3 through a contact hole. The pixel defining layer PDL may be disposed on the upper insulating layer VIA1 to expose at least a portion of the anode electrode AE. The light emitting layer EML may be disposed on the anode electrode AE. The cathode electrode CE may be disposed on the light emitting layer EML.

When the light emitting element ED is an organic light emitting diode (OLED), the light emitting layer EML may include an organic material. The encapsulation layer TFL may seal the light emitting element layer ELL to protect the light emitting element layer ELL against external oxygen or moisture. The encapsulation layer TFL may be a layer in which an organic layer and an inorganic layer are mixed.

FIG. 6 is a plan view illustrating a partial area of the display device according to an embodiment. FIG. 6 is an enlarged and exploded plan view of an area AA' of FIG. 4.

Referring to FIGS. 4 to 6, the pad area PA may be defined in the display panel DP. The pad area PA may be defined on a portion of the mounting area MA and may be an area on which the display pads SD are disposed.

A substrate pad area PA-CF of the flexible circuit board part FPC of the flexible circuit board CF and the pad area PA of the display panel DP may be electrically connected to each other by the conductive adhesive film ACF. The pad part of the main circuit board MB may include pads electrically connected to the substrate pads LD of the flexible circuit board part FPC. An input pad part of the flexible circuit board part FPC and the pad part of the main circuit board MB may also be electrically connected to each other by the conductive adhesive film ACF. The conductive adhesive film ACF may be an anisotropic conductive film (ACF). A shoulder bump may replace the conductive adhesive film (ACF). The substrate pads LD disposed on the substrate pad area PA-CF of the flexible circuit board part FPC may be electrically connected to the display pads SD disposed on the pad area PA of the display panel DP by the conductive adhesive film ACF. The conductive adhesive film ACF may include a plurality of conductive balls CB. When the conductive adhesive film ACF is pressed between the flexible circuit board part FPC and the display panel DP, the plurality of conductive balls CB aligned in the first direction may electrically connect the substrate pad LD of the flexible circuit board part FPC to the display pads SD of the display panel DP.

The flexible circuit board part FPC provided in the flexible circuit board CF includes a plurality of circuit pads LD and circuit lines CL connected to the substrate pads LD. The plurality of circuit pads LD may be disposed in the substrate pad area PA-CF. The plurality of circuit pads LD may be disposed on the circuit base layer BL-F of the flexible circuit board part FPC. Although FIG. 6 illustrates components such as the plurality of circuit pads LD provided in the flexible circuit board CF as solid lines for convenience of description, the embodiments are not limited thereto. For example, the components provided in the flexible circuit board CF may be disposed on a rear surface of the circuit base layer BL-F.

At least a portion of the plurality of circuit pads LD may be electrically connected to the data driving circuit DC provided in the flexible circuit board CF through the circuit lines CL.

The flexible circuit board part FPC may further include indicia that may be in the form of a circuit alignment mark ALM-C. The circuit alignment mark ALM-C may have a shape in which at least a portion of the circuit alignment mark ALM-C overlaps the substrate pad area PA-CF. The circuit alignment mark ALM-C may have a shape in which at least a portion of the circuit alignment mark ALM-C overlaps the plurality of circuit pads LD in the second direction DR2. The circuit alignment mark ALM-C may be used as a mark for grasping a position of the flexible circuit board CF or used as an identification mark for aligning the flexible circuit board CF and the display panel DP in the process of bonding the flexible circuit board CF to the display panel DP.

The display panel DP includes a plurality of display pads SD. The plurality of display pads SD may be disposed on the base substrate BL of the display panel DP. The plurality of display pads SD may be disposed on the pad area PA of the display panel DP.

Each of the plurality of display pads SD may have a shape corresponding to each of the substrate pads LD provided in the flexible circuit board CF. That is, the plurality of display pads SD may have a longitudinal axis that is in alignment with the longitudinal axis of the substrate pads LD. The signal lines SGL may be connected to the plurality of display pads SD. For example, the data lines DL or the control signal lines CSL may be connected to the plurality of display pads SD.

The display panel DP may further include indicia that may be in the form of a panel alignment mark ALM-P. The panel alignment mark ALM-P may be disposed in the pad area PA of the display panel DP. At least a portion of the panel alignment mark ALM-P may extend along the first direction DR1 or the second direction DR2. As illustrated in FIG. 6, the panel alignment mark ALM-P may have a "T" shape when viewed in plan. The panel alignment mark ALM-P may have a shape corresponding to the circuit alignment mark ALM-C and may be used as a mark for grasping a position of the display panel DP or used as an identification mark for aligning the display panel DP and the flexible circuit board CF in the process of bonding the flexible circuit board CF to the display panel DP.

Figure 8:
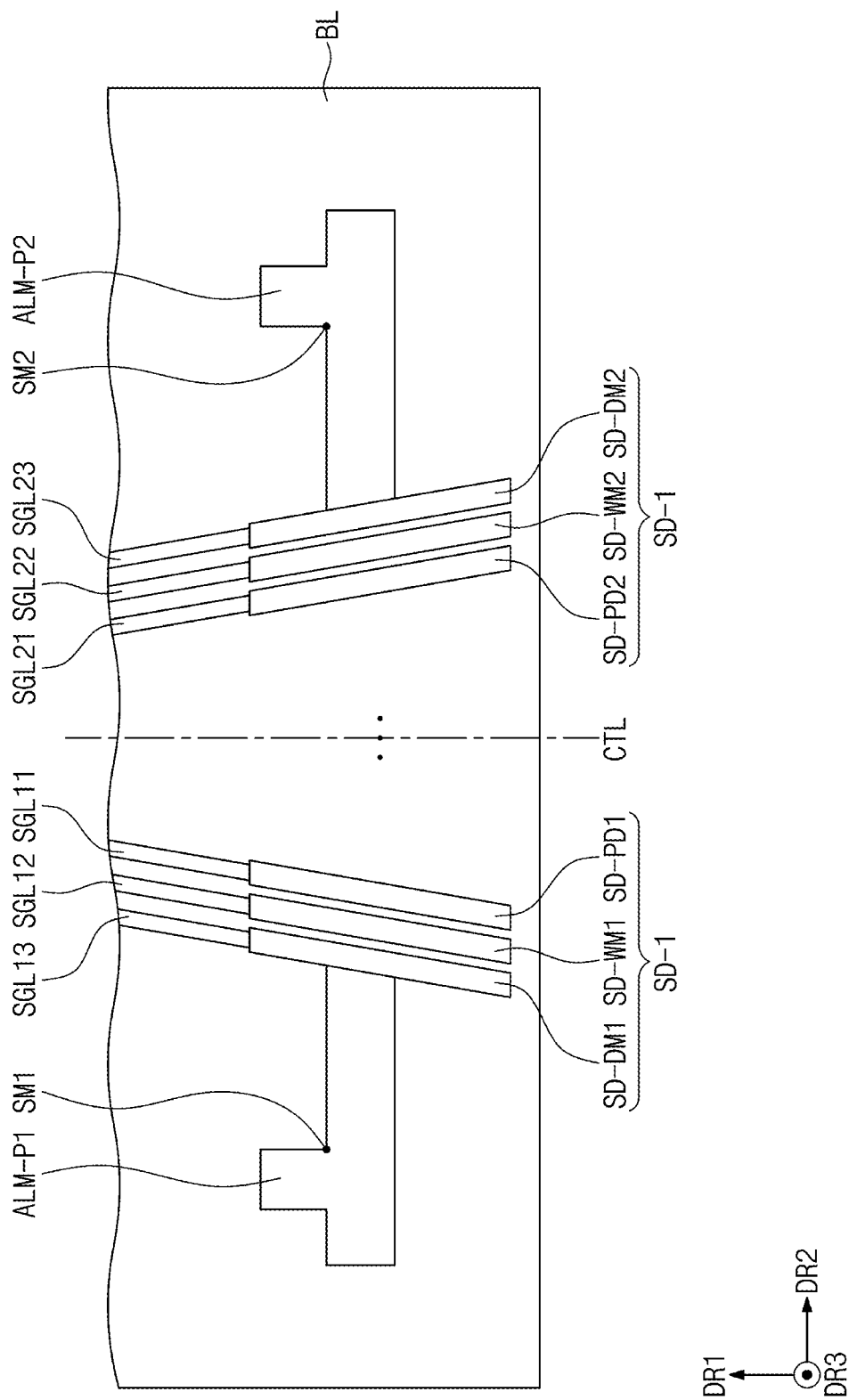
FIG. 8 is an enlarged plan view illustrating a partial area of the display panel of FIG. 6.
Figure 9:
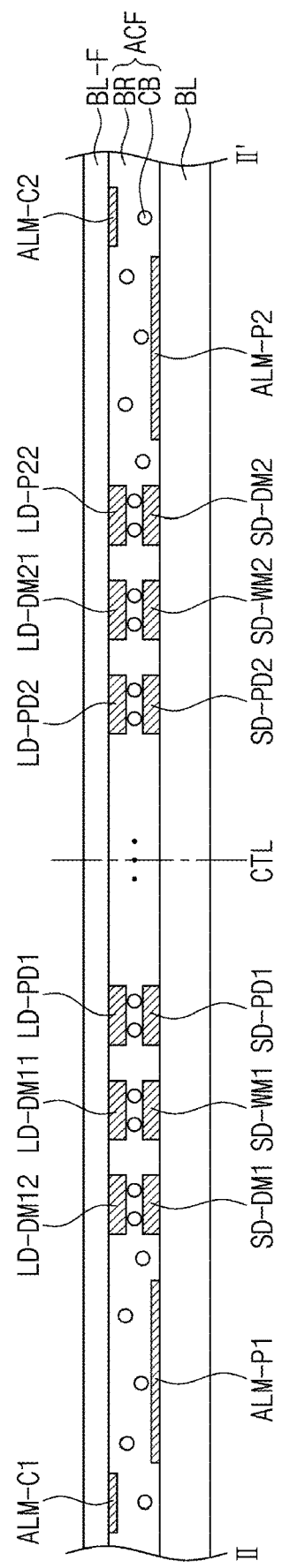
FIG. 9 is a cross-sectional view off the flexible circuit board and the display panel taken along line II-II' of FIG. 6.
Figure 10A:
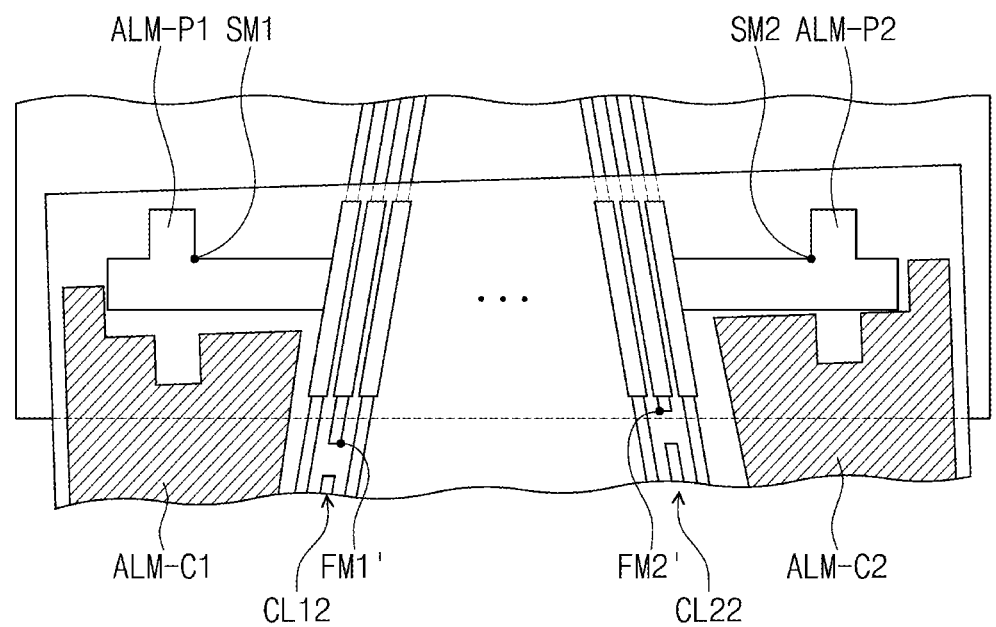
Figure 11:
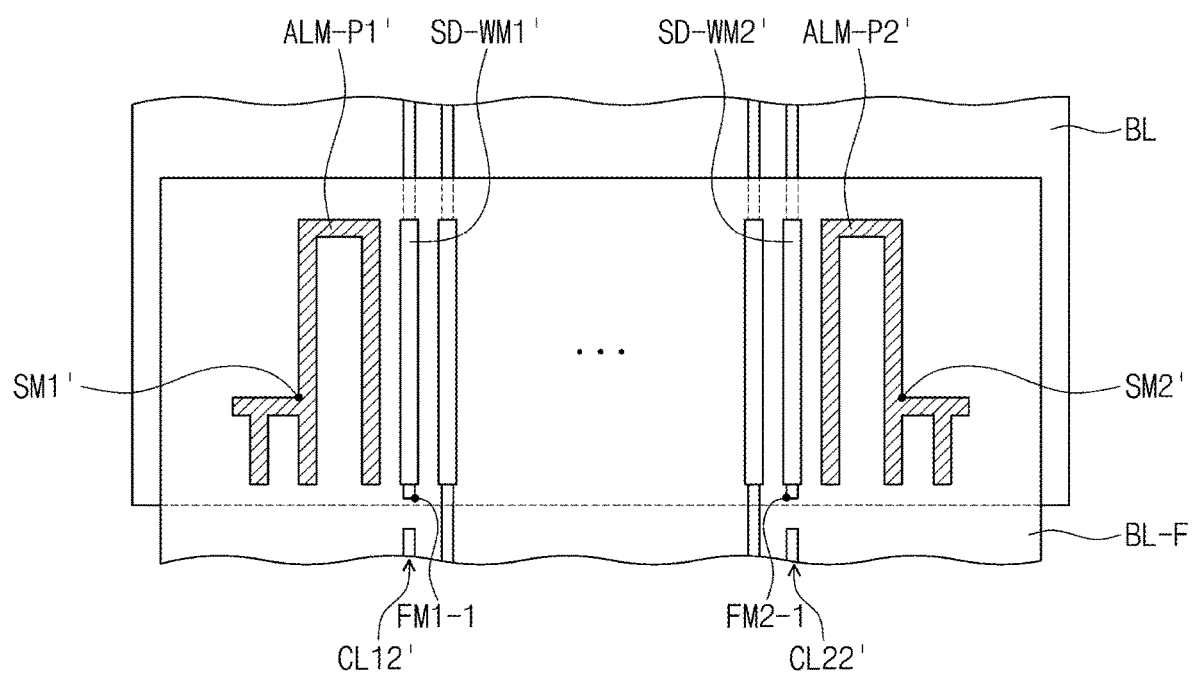
FIG. 11 is a plan view illustrating another embodiment of the display panel and the flexible circuit board bonded to each other on the area AA of FIG. 6.

FIGS. 7A and 7B are enlarged plan views illustrating a partial area of the flexible circuit board according to an embodiment. FIG. 8 is an enlarged plan view illustrating a partial area of the display panel according to an embodiment. FIG. 9 is a cross-sectional view illustrating a partial area of the display device according to an embodiment. FIGS. 10A and 10B are plan views illustrating a partial area of the display device according to an embodiment. FIG. 11 is a plan view illustrating a partial area of a display device according to another embodiment. FIGS. 7A and 7B illustrate the circuit pads and peripheral components of the flexible circuit board of FIG. 6. FIG. 8 illustrates the display pads and peripheral components of the display panel of FIG. 6. FIG. 9 illustrates a coupling cross-sectional view of the flexible circuit board and the display panel, which corresponds to a cutting line taken along line II-II' of FIG. 6. FIGS. 10A, 10B, and 11 a plan view illustrating a state in which the display panel and the flexible circuit board are bonded to each other on the area AA of FIG. 6.

Referring to FIGS. 4, 6, and 7A, the flexible circuit board CF includes a plurality of circuit pads LD and circuit lines CL connected to the substrate pads LD. The plurality of circuit pads LD may be disposed in the substrate pad area PA-CF. The plurality of circuit pads LD may be disposed on the circuit base layer BL-F of the flexible circuit board part FPC. Although FIGS. 7A and 7B illustrate components such as the plurality of circuit pads LD provided in the flexible circuit board CF as solid lines for convenience of description, the embodiment is not limited thereto. For example, the components provided in the flexible circuit board CF may be disposed on a rear surface of the circuit base layer BL-F.

The plurality of circuit pads LD may have a shape corresponding to the plurality of display pads SD provided in the display panel DP. The plurality of circuit pads LD may have longitudinal axes extending in a diagonal direction between the first direction DR1 and the second direction DR2. The plurality of circuit lines CL connected to the plurality of circuit pads LD may also have longitudinal axes extending in a diagonal direction.

The plurality of circuit pads LD may include left substrate pads LD-1 defined at a central portion in the second direction DR2 of the flexible circuit board part FPC and arranged at a left side of the flexible circuit board part FPC with respect to a central line CTL intersecting the first direction DR1 and right substrate pads LD-2 arranged at a right side of the flexible circuit board part FPC with respect to the central line CTL. The left substrate pads LD-1 and the right substrate pads LD-2 may be symmetrical with respect to the central line CTL.

The plurality of circuit pads LD include substrate pads LD-PD1 and LD-PD2 arranged in the second direction DR2 and additional pads LD-DM11, LD-DM12, LD-DM21, and LD-DM22. The substrate pads LD-PD1 and LD-PD2 may be pads electrically connected to the input pads SD-PD1 and SD-PD2 (see FIG. 8) of the display panel DP to provide an electrical signal for driving the display panel DP to the display panel DP. The additional pads LD-DM11, LD-DM12, LD-DM21, and LD-DM22 may be pads electrically connected to window pads SD-WM1 and SD-WM2 (see FIG. 8) and panel dummy pads SM-DM1 and SM-DM2 (see FIG. 8) of the display panel DP so as not to substantially provide a signal. However, the embodiments of the invention are not limited thereto. For example, the additional pads LD-DM11, LD-DM12, LD-DM21, and LD-DM22 of the plurality of circuit pads LD may also provide a predetermined signal for driving and testing the display module DM.

The substrate pads LD-PD1 and LD-PD2 of the plurality of circuit pads LD may include a left substrate pad LD-PD1 disposed at a left side of the flexible circuit board part FPC with respect to the central line CTL and a right substrate pad LD-PD2 disposed at a right side of the flexible circuit board part FPC with respect to the central line CTL. Although FIG. 7A illustrates only one left substrate pad LD-PD1 and one right substrate pad LD-PD2 for convenience, each of the left substrate pad LD-PD1 and the right substrate pad LD-PD2 may be provided in plurality. The additional pads LD-DM11, LD-DM12, LD-DM21, and LD-DM22 of the plurality of circuit pads LD may include left additional pads LD-DM1 and LD-DM2 disposed at the left side of the flexible circuit board part FPC with respect to the central line CTL and right additional pads LD-DM21 and LD-DM22 disposed at the right side of the flexible circuit board part FPC with respect to the central line CTL. The left additional pads LD-DM11 and LD-DM12 may include a first left additional pad LD-DM11 and a second left additional pad LD-DM12, and the right additional pads LD-DM21 and the LD-DM22 may include a first right additional pad LD-DM21 and a second right additional pad LD-DM22.

The circuit lines CL connected to the substrate pads LD include output lines CL11 and CL21 connected to the substrate pads LD-PD1 and LD-PD2 and additional circuit lines CL12, CL13, CL21, and CL22 connected to the additional pads LD-DM11 and LD-DM12, LD-DM21, and LD-DM22. The output lines CL11 and CL21 may include a left output line CL11 disposed at the left side of the flexible circuit board part FPC with respect to the central line CTL and connected to the left substrate pad LD-PD1 and a right output line CL12 disposed at the right side of the flexible circuit board part FPC with respect to the central line CTL and connected to the right substrate pad LD-PD2. The additional circuit lines CL12, CL13, CL21, CL22 may include left additional circuit lines CL12 and CL13 disposed at the left side of the flexible circuit board part FPC with respect to the central line CTL and connected to the left additional pads LD-DM11 and LD-DM12 and right additional circuit lines CL22 and CL23 disposed at the right side of the flexible circuit board part FPC with respect to the central line CTL and connected to the right additional pads LD-DM21 and DL-DM22.

At least one of the additional circuit lines CL12, CL13, CL21, or CL22 includes a first portion connected to the additional pads LD-DM11, LD-DM12, LD-DM21, and LD-DM22 and a second portion spaced apart from the first portion in the longitudinal direction of the additional circuit lines CL12, CL13, CL21, and CL22. In an embodiment, the first left additional circuit line CL12 connected to the first left additional pad LD-DM11 and the second right additional circuit line CL22 connected to the first right additional pad LD-DM21 may include the first portion and the second portion. The first left additional circuit line CL12 may include a first left portion CL12-1 connected to the first left additional pad LD-DM11 and a second left portion CL12-2 spaced apart from the first left portion CL12-1 in the longitudinal direction of the circuit line. The first right additional circuit line CL22 may include a first right portion CL22-1 connected to the first right additional pad LD-DM21 and a second right portion spaced apart from the first right portion CL22-1 in the longitudinal direction of the circuit line. The additional pads to which the additional circuit lines including the first part and the second part is connected may be referred to as a "dummy pads". Further, the additional circuit lines connected to the "dummy pads" may be referred to as a "dummy circuit lines".

Unlike illustrated in FIG. 7A, the second left additional circuit line CL13 connected to the second left additional pad LD-DM12 among the additional circuit lines CL12, CL13, CL21, and CL22 may include a first portion and a second portion spaced apart from the first portion. The second right additional circuit line CL23 connected to the second right additional pad LD-DM22 among the additional circuit lines CL12, CL13, CL21, and CL22 may include a first portion and a second portion spaced apart from the first portion. Alternatively, each of all the additional circuit lines CL12, CL13, C121, and CL22, which are respectively connected to the first left additional pad LD-DM11, the second left additional pad LD-DM12, the first right additional pad LD-DM21, and the second right additional pad LD-DM22 may include a first portion and a second portion spaced apart from the first portion.

Since at least one of the additional circuit lines CL12, CL13, CL21, and CL22 includes the first portion and the second portion, a predetermined line gap CL-G may be defined between the first portion and the second portion. As illustrated in FIG. 7A, the first left additional circuit line CL12 may include the first left portion CL12-1 connected to the first left additional pad LD-DM11 and the second left portion CL12-2 spaced apart from the first left portion CL12-1 in the longitudinal direction, and the predetermined line gap CL-G may be defined between the first left portion CL12-1 and the second left portion CL12-2. The first right additional circuit line CL22 may include a first right portion CL22-1 connected to the first right additional pad LD-DM21 and a second right portion spaced apart from the first right portion CL22-1 in the longitudinal direction of the circuit line, and the predetermined line gap CL-G may be defined between the first right portion CL22-1 and the second right portion CL22-2. A distance d2 between the first portion and the second portion defined by the predetermined line gap CL-G may be greater than the length d1 of the first portion of each of the additional circuit lines. In one specific embodiment, the length d1 of the first portion of the additional circuit lines may be about 0.2 micrometers, and the distance d2 between the first portion and the second portion may be about 0.3 micrometers.

Since at least one of the additional circuit lines CL12, CL13, CL21, and CL22 includes the first portion and the second portion, reference points that may be in the form or reference marks FM1 and FM2 may be defined at an end of the first portion or an end of the second portion. As illustrated in FIG. 7A, a left reference mark FM1 may be defined at an end of the first right portion CL12-1 of the first left additional circuit line CL12, and a right reference mark FM2 may be defined at an end of the first right portion CL22-1 of the first right additional circuit line CL22. In a state in which the flexible circuit board CF is not bonded to the display panel DP, the left reference mark FM1 and the right reference mark FM2 may be defined at positions substantially symmetrical to each other with respect to the central line CTL.

Since at least one of the additional circuit line CL12, CL13, CL21, or CL22 connected to the additional pads LD-DM11, LD-DM12, LD-DM21, and LD-DM22 includes the first portion and the second portion, the end of the first portion or the end of the second portion may function as a reference mark. Particularly, one of the left additional circuit lines CL12 and CL13 disposed at the left side and one of the right additional circuit lines CL22 and CL23 disposed at the right side among the additional circuit lines CL12, CL13, CL21, and CL22 may include the first portion and the second portion and thus may include a left reference mark FM1 and a right reference mark FM2. Thus, in the process of bonding the flexible circuit board to the display panel, the degree of elongation of the flexible circuit board, that is, the elongation rate of the flexible circuit board may be easily and accurately measured by use of the left reference mark FM1 and the right reference mark FM2 to improve reliability of the display device.

In FIG. 7A, although at least one of the additional circuit line CL12, CL13, CL21, or CL22 includes the first portion and the second portion to define one line gap CL-G between the first portion and the second portion, the embodiments of the invention are not limited thereto. For example, a plurality of line gaps may be defined in at least one of the additional circuit lines CL12, CL13, CL21, and CL22. For example, at least one of the additional circuit line CL12, CL13, CL21, or CL22 may include a first portion, a second portion, a third portion, and a line gap may be defined between the first portion and the second portion, a line gap may be defined between the second portion and the third portion. The first left additional circuit line CL12 may include a first left portion connected to the first left additional pad LD-DM11, a second left portion spaced apart from the first left portion in the circuit longitudinal direction, and a third left portion spaced apart from the second left portion in the circuit longitudinal direction. Here, predetermined line gaps may be defined between the first left portion and the second left portion and between the second left portion and the third left portion, respectively. The first right additional circuit line CL22 may include a first right portion connected to the first right additional pad LD-DM21, a second right portion spaced apart from the first right portion in the circuit longitudinal direction, and a third right portion spaced apart from the second right portion in the circuit longitudinal portion. Here, predetermined line gaps may be defined between the first right portion and the second right portion and between the second right portion and the third right portion, respectively. Since the plurality of line gaps are defined in at least one of the additional circuit line CL12, CL13, CL21, or CL22, a plurality of reference marks may be provided in the line in which the plurality of line gaps are defined. For example, in the first left additional circuit line CL12 including first left portion, the second left portion, and the third left portion, two or more reference marks may be defined at each of ends of the first left portion, the second left portion, and the third left portion. Two or more reference marks may be defined at each of ends of the first right portion, the second right portion, and the third right portion in the first right additional circuit line CL22 including the first right portion, the second right portion, and the third right portion.

The flexible circuit board part FPC may further include indicia in the form of a circuit alignment mark ALM-C. The circuit alignment mark ALM-C may include a left circuit alignment mark ALM-C1 disposed at the left side of the flexible circuit board part FPC with respect to the central line CTL and a right circuit alignment mark ALM-C2 disposed at the right side of the flexible circuit board part FPC with respect to the central line CTL.

FIG. 7B illustrates a modified example of the flexible circuit board of FIG. 7A. Hereinafter, in the description of the flexible circuit board with reference to FIG. 7B, the same reference numerals will be assigned to the configurations already described in the description of FIG. 7A, and repetitive descriptions will be omitted to avoid redundancy.

Referring to FIG. 7B, reference marks FM-PP1 and FM-PP2 provided in the flexible circuit board part FPC may not be defined by a cutoff part disposed on the circuit lines but may be provided as at least one pattern disposed between the additional circuit lines CL12, CL13, CL22, CL23 and the circuit alignment mark ALM-C. The reference marks FM-PP1 and FM-PP2 may include a left reference mark FM-PP1 disposed between the left additional circuit lines CL12 and CL13 and the left circuit alignment mark ALM-C1 and a right reference mark FM-PP2 disposed between the right additional circuit lines CL22 and CL23 and the right circuit alignment mark ALM-C2. In FIG. 7B, each of the left reference mark FM-PP1 and the right reference mark FM-PP2 has a generally rectangular shape when viewed in plan, but is not limited thereto. For example, each of the left reference mark FM-PP1 and the right reference mark FM-PP2 may have shapes without limitation as long as the reference mark functions as a mark for measuring the elongation rate of the flexible circuit board. For example, each of the left reference mark FM-PP1 and the right reference mark FM-PP2 may have a generally circular shape or a generally triangular shape.

Referring to FIGS. 4 and 6 to 8, the display panel DP includes a plurality of display pads SD. The plurality of display pads SD may be disposed on the base substrate BL of the display panel DP. The plurality of display pads SD may be disposed on the pad area PA of the display panel DP.

Each of the plurality of display pads SD may have a shape corresponding to one of the substrate pads LD provided in the flexible circuit board CF. The plurality of display pads SD may extend in the diagonal direction between the first direction DR1 and the second direction DR2. That is, the longitudinal direction of the plurality of display pads SD may be substantially the same as the longitudinal direction of the substrate pads LD. Signal lines SGL such as data lines DL and control signal lines CSL may be connected to the plurality of display pads SD, and the longitudinal direction of the signal lines SGL may also be in the diagonal direction.

A panel central line CTL' corresponding to the central line CTL defined on the flexible circuit board part FPC may be defined on the display panel DP. The plurality of display pads SD may include left display pads SD-1 arranged at a left side of the display panel DP with respect to the panel central line CTL' and right display pads SD-2 arranged on a right side of the display panel DP with respect to the panel central line CTL'. The left display pads SD-1 and the right display pads SD-2 may be substantially symmetrical to each other with respect to the panel central line CTL'.

The plurality of display pads SD may include input pads SD-PD1 and SD-PD2, window pads SD-WM1 and SD-WM2, and panel dummy pads SD-DM1 and SD-DM2, which are arranged in the second direction DR2. The input pads SD-PD1 and SD-PD2 may be electrically connected to the substrate pads LD-PD1 and LD-PD2 of the flexible circuit board part FPC, and the window pads SD-WM1 and SD-WM2 and the panel dummy pads SD-DM1 and SD-DM2 may be electrically connected to the dummy pads LD-DM11, LD-DM12, LD-DM21, and LD-DM22 of the flexible circuit board part FPC.

The input pads SD-PD1 and SD-PD2 of the plurality of display pads SD may include a left input pad SD-PD1 disposed at the left side of the display panel DP with respect to the panel central line CTL' and a right input pad SD-PD2 disposed at a right side of the display panel DP with respect to the panel central line CTL'. Although FIG. 8 illustrates only one left input pad SD-PD1 and one right input pad SD-PD2 for convenience, each of the left input pad SD-PD1 and the right input pad SD-PD2 may be provided in plurality. The window pads SD-WM1 and SD-WM2 of the plurality of display pads SD may include a left window pad SD-WM1 disposed at the left side of the display panel DP with respect to the panel central line CTL' and a right window pad SD-WM2 disposed at the right side of the display panel DP with respect to the panel central line CTL'. The panel dummy pads SD-DM1 and SD-DM2 of the plurality of display pads SD may include a left panel dummy pad SD-DM1 disposed at the left side of the display panel DP with respect to the panel central line CTL' and a right panel dummy pad SD-DM2 disposed at a right side of the display panel DP with respect to the panel central line CTL'.

The signal lines SGL include data lines SGL11 and SGL21 connected to the input pads SD-PD1 and SD-PD2 and dummy lines CL12, CL13, CL21, and CL22 connected to the window pads SD-WM1 and SD-WM2 and panel dummy pads SD-DM1 and SD-DM2. The data lines SGL11 and SGL21 may include a left data line SGL11 disposed at the left side of the display panel DP with respect to the panel central line CTL' and a right data line SGL21 disposed to the right of the display panel DP with respect to the panel central line CTL'. The dummy lines CL12, CL13, CL21, and CL22 may include left dummy lines SGL12 and SGL13 disposed at the left side of the display panel DP with respect to the panel central line CTL' and right dummy lines SGL22 and SGL23 disposed at the right side of the display panel DP with respect to the panel central line CTL'.

The display panel DP may further include a panel alignment mark ALM-P. The panel alignment mark ALM-P may include a left panel alignment mark ALM-P1 disposed at the left side of the display panel DP with respect to the panel central line CTL' and a right panel alignment mark ALM-P2 disposed at the right side of the display panel DP with respect to the panel central line CTL'.

Reference points SM1 and SM2 may be defined on the panel alignment mark ALM-P. The panel alignment mark ALM-P may have a "T" shape in which a portion protruding in the first direction DR1 from the middle of the portion extending in the second direction DR2, and the reference points SM1 and SM2 may be defined at recessed points of the "T" shape. The display panel DP may include a first reference point SM1 defined at the left panel alignment mark ALM-P1 and a second reference point SM2 defined at the right panel alignment mark ALM-P2. The reference points SM1 and SM2 defined at the panel alignment mark ALM-P may provide points that serve as reference points of position coordinates of the reference marks when the elongation rate of the flexible circuit board is measured in the process of bonding the flexible circuit board to the display panel.

Referring to FIGS. 4, 6 to 9, in the cross-section in which the display panel DP and the flexible circuit board CF are bonded to each other through the conductive adhesive film ACF, the plurality of display pads SD provided in the display panel DP and the plurality of circuit pads LD provided in the flexible circuit board CF may be disposed at positions corresponding to each other. The plurality of conductive balls CB may be interposed between the plurality of display pads SD and the plurality of circuit pads LD to electrically connect the plurality of display pads SD to the plurality of circuit pads LD.

The substrate pads LD-PD1 and LD-PD2 may be electrically connected to the input pads SD-PD1 and SD-PD2 by the plurality of conductive balls CB, and the dummy pads LD-DM11, LD-DM12, LD-DM21, and LD-DM22 may be electrically connected to the window pads SD-WM1 and SD-WM2 and the panel dummy pads SD-DM1 and SD-DM2 by the plurality of conductive balls CB.

In FIG. 9, although the panel alignment mark ALM-P provided in the display panel DP and the circuit alignment mark ALM-C provided in the flexible circuit board part FPC are illustrated as not corresponding to each other in the cross-section in which the display panel DP and the flexible circuit board CF are bonded to each other, the embodiments of the invention are not limited thereto. For example, since the panel alignment mark ALM-P and the circuit alignment mark ALM-C correspond to each other in the cross-section, at least portions of the panel alignment mark ALM-P and the circuit alignment mark ALM-C may overlap each other. The panel alignment mark ALM-P and the circuit alignment mark ALM-C may have corresponding shapes to align the display panel DP with the flexible circuit board CF when the flexible circuit board CF and the display panel DP are bonded to each other.

The plurality of display pads SD provided in the display panel DP may have substantially the same thickness. That is, the input pads SD-PD1 and SD-PD2, the window pads SD-WM1 and SD-WM2, and the panel dummy pads SD-DM1 and SD-DM2, which are provided in the plurality of display pads SD may have substantially the same thickness and may be formed through the same process. The input pads SD-PD1 and SD-PD2, the window pads SD-WM1 and SD-WM2, and the panel dummy pads SD-DM1 and SD-DM2 may contain the same metal and be formed to be patterned together through the same process.

The plurality of substrate pads LD provided in the flexible circuit board part FPC may have substantially the same thickness. That is, the substrate pads LD-PD1 and LD-PD2 provided in the flexible circuit board part FPC and the dummy pads LD-DM11, LD-DM12, LD-DM21, and LD-DM22 may have substantially the same thickness and may be formed through the same process. The substrate pads LD-PD1 and LD-PD2, and the dummy pads LD-DM11, LD-DM12, LD-DM21, and LD-DM22 may contain the same metal and be formed to be patterned together through the same process.

Each of the panel alignment mark ALM-P and the circuit alignment mark ALM-C may have a thickness less than that of each of the pads provided in the display panel DP and the flexible circuit board CF. Each of the panel alignment mark ALM-P and the circuit alignment mark ALM-C may have only a minimum thickness that is necessary for the alignment when the display panel DP and the flexible circuit board CF are bonded to each other and may not substantially protrude. However, the embodiments of the invention are not limited thereto. For example, each of the panel alignment mark ALM-P and the circuit alignment mark ALM-C may have substantially the same thickness as each of the pads provided in the display panel DP and the flexible circuit board CF.

Referring to FIGS. 4, 6 to 9, and 10A, in the state in which the display panel DP and the flexible circuit board CF are bonded to each other, the plurality of reference marks FM1' and FM2' defined in the dummy circuit lines CL12 and CL22 may not be parallel to each other in the second direction DR2. That is, the left reference mark FM1' defined in the first left dummy circuit line CL12 and the right reference mark FM2' defined in the first right dummy circuit line CL22 may not be parallel to each other in the second direction DR2. The left reference mark FM1' and the right reference mark FM2' may not overlap each other in the second direction DR2. When the flexible circuit board CF and the display panel DP are bonded to each other, the left reference mark FM1' and the right reference mark FM2' may be elongated by heat and a pressure in the process in which the circuit base layer BL-F provided in the flexible circuit board CF and containing the flexible material is bonded and thus may not be parallel to each other in the second direction DR2.

However, the embodiments of the invention are not limited thereto. For example, in the state in which the display panel DP and the flexible circuit board CF are bonded to each other, the plurality of reference marks FM1 and FM2 defined in the dummy circuit lines CL12 and CL22 may not be parallel to each other in the second direction DR2. That is, the left reference mark FM1 defined in the first left dummy circuit line CL12 and the right reference mark FM2 defined in the first right dummy circuit line CL22 may be parallel to each other in the second direction DR2. The left reference mark FM1 and the right reference mark FM2 may overlap each other in the second direction DR2. When the flexible circuit board CF and the display panel DP are bonded to each other, in the process in which the circuit base layer BL-F provided in the flexible circuit board CF and containing the flexible material is bonded may be elongated by the heat and the pressure, which are applied in the bonding process. However, the elongation rate of the circuit base layer BL-F may be calculated to compensate and design the left reference marker FM1 and the right reference marker FM2 may be parallel to each other in the second direction DR2.

Referring to FIGS. 4, 6, and 11, the plurality of display pads SD provided in the display panel DP, the substrate pads LD provided in the flexible circuit board part FPC, and the plurality of lines connected to the pads may not extend in the diagonal direction but extend substantially parallel to the first direction DR1.

The panel alignment marks ALM-P1' and ALM-P2' disposed on the base substrate BL of the display panel DP may have a structure in which a portion thereof has a "T" shape in plan. The panel alignment marks ALM-P' and ALM-P2' may include a left panel alignment mark ALM-P1' disposed at the left side of the display panel DP and a right panel alignment mark ALM-P2' disposed at the right side of the display panel DP. Reference points SM1' and SM2' may be defined on the panel alignment marks ALM-P1' and ALM-P2'. The reference points SM1' and SM2' defined at the panel alignment marks ALM-P1' and ALM-P2' may provide points that serve as reference points of position coordinates of the reference marks when the elongation rate of the flexible circuit board is measured in the process of bonding the flexible circuit board to the display panel. A circuit alignment mark overlapping at least a portion of the panel alignment marks ALM-P1' and ALM-P2' may be disposed on the circuit base layer BL-F of the flexible circuit board part FPC.

Similar to the above description, in the dummy pads of the flexible circuit board part FPC connected to the window pads SD-WM1' and SD-WM2', each of the dummy circuit lines connected to the dummy pads may include a first portion and a second portion spaced apart from the first portion. Accordingly, the reference marks FM1-1 and FM2-1 may be defined at ends of the first portion provided in each of the dummy circuit lines CL12' and CL22'. More specifically, a left reference mark FM1-1 may be defined at an end of the first portion of the left dummy circuit line CL12', and a right reference mark FM2-1 may be defined at an end of the first portion of the right dummy circuit line CL22'. Thus, in the process of bonding the flexible circuit board to the display panel, the degree of elongation of the flexible circuit board, that is, the elongation rate of the flexible circuit board may be easily and accurately measured through the reference marks FM1 and FM2 to improve the reliability of the display device. The dummy circuit lines CL12' and CL22' in which the reference marks FM1-1 and FM2-1 are defined may extend in a direction substantially parallel to the first direction DR1. Hereinafter, an example method of manufacturing a display device will be described with reference to the drawings.

Figure 12:
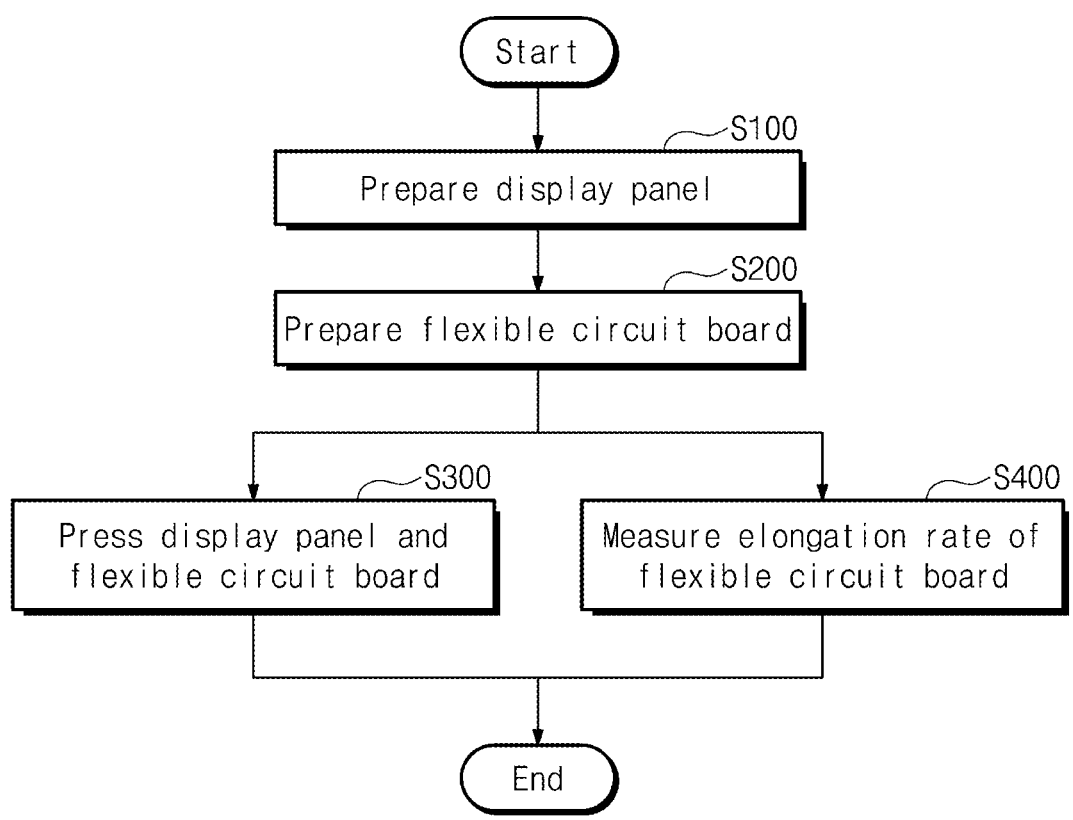
FIG. 12 is a flowchart illustrating an embodiment of a method for manufacturing a display device according to of the principles of the invention.
Figure 13:
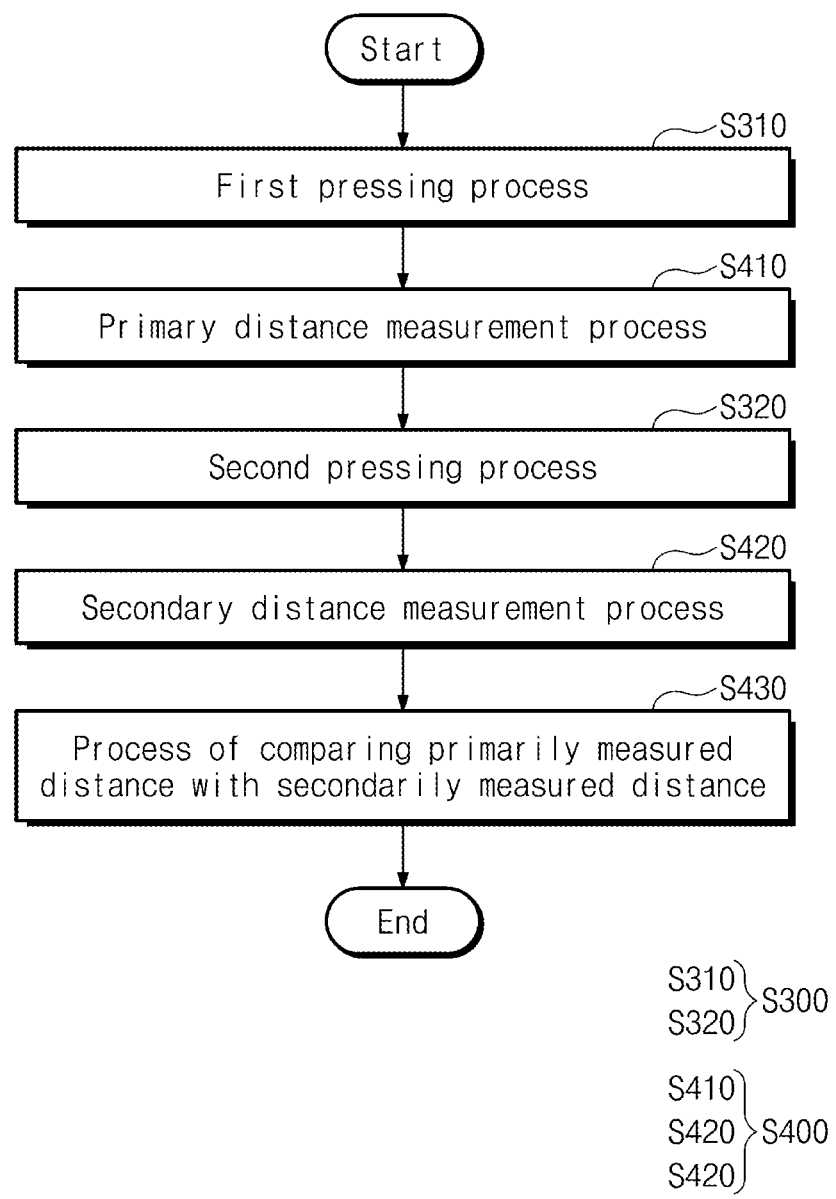
FIG. 13 is a flowchart illustrating an embodiment of partial processes of the method for manufacturing the display device.

FIG. 12 is a flowchart illustrating a method for manufacturing a display device according to an embodiment. FIG. 13 is a flowchart illustrating partial processes of the method for manufacturing the display device according to an embodiment. FIG. 13 is a flowchart illustrating a process of pressing a display panel and a flexible circuit board and a process of measuring an elongation rate of the flexible circuit board in the method for manufacturing the display device according to an embodiment.

Referring to FIG. 12, the method for manufacturing the display device includes a process (S100) of preparing a display panel, a process (S200) of preparing a flexible circuit board, a process (S300) of pressing the display panel and the flexible circuit board, and a process (S400) of measuring an elongation rate of the flexible circuit board. In the process (S400) of measuring the elongation rate of the flexible circuit board, a distance between a plurality of reference marks provided in the flexible circuit board is measured.

Referring to FIGS. 4, 6 to 9, 10A, 10B, and 12, the flexible circuit board CF includes a plurality of circuit pads LD. The flexible circuit board CF includes at least one reference mark. For example, as illustrated in FIG. 7A, in the flexible circuit board CF, a first left dummy circuit line CL12 may include a first left portion CL12-1 connected to a first left dummy pad LD-DM11 and a second left portion CL12-2 spaced apart from the first left portion CL12-1 in a longitudinal direction, and a first right dummy circuit line CL22 may include a first right portion CL22-1 connected to a first right dummy pad LD-DM21 and a second right portion CL22-2 spaced apart from the first right portion CL22-1 in the circuit longitudinal direction. A left reference mark FM1 may be defined on an end of the first left portion CL12-1 of the first left dummy circuit line CL12, and a right reference mark FM2 may be defined on an end of the first right portion CL22-1 of the first right dummy circuit line CL22. Alternatively, as illustrated in FIG. 7B, the flexible circuit board CF may include a left reference mark FM-PP1 disposed between the left dummy circuit lines CL12 and CL13 and the left circuit alignment mark ALM-Cl and a right reference mark FM-PP2 disposed between the right dummy circuit lines CL22 and CL23 and the right circuit alignment mark ALM-C2.

The display panel DP may include a plurality of display pads SD and a panel alignment mark ALM-P, and reference points SM1 and SM2 may be defined on the panel alignment mark ALM-P. The display panel DP may include a first reference point SM1 defined at the left panel alignment mark ALM-P1 and a second reference point SM2 defined at the right panel alignment mark ALM-P2.

In the process (S300) of pressing the display panel and the flexible circuit board, a plurality of circuit pads LD provided in the flexible circuit board CF and a plurality of display pads SD provided in the display panel DP may be bonded to each other through a conductive adhesive film ACF and then be electrically connected to each other.

Referring to FIG. 13, the process (S300) of pressing the display panel and the flexible circuit board may include a first pressing process (S310) of pressing the display panel and the flexible circuit board together at a first pressure and a second pressing process (S330) of pressing the display panel and the flexible circuit board together at a second pressure. The second pressure may be higher than the first pressure. Heat having a first temperature may be applied in the first pressing process, and heat having a second temperature may be applied in the second pressing process. The second temperature may be higher than the first temperature. That is, the process (S300) of pressing the display panel and the flexible circuit board may include a process of mainly pressing the display panel and the flexible circuit board at a higher temperature after a process of previously pressing the display panel and the flexible circuit board at a lower temperature. After the second pressing process, the display panel and the flexible circuit board may be completely bonded to each other.

The process (S400) of measuring the elongation rate of the flexible circuit board may include a primary distance measurement process (S410) of measuring a distance between a plurality of reference marks, a secondary distance measurement process (S420) of measuring a distance between the plurality of reference marks, and a process (S430) of comparing the primary measurement distance with the secondary measurement distance. The first distance measurement process (S410) may be performed after the first pressing process (S310) and before the second pressing process (S320). The second distance measurement process (S420) may be performed after the second pressing process (S320).

FIGS. 14A and 14B are plan views illustrating partial processes of the method for manufacturing the display device according to an embodiment. FIG. 14A illustrates a state of the process of measuring a primary distance after the first pressing process. FIG. 14B illustrates a state of the process of measuring a secondary distance after the second pressing process.

Referring to FIGS. 13 and 14A, after the first pressing process (S310), in the primary distance measuring process (S410), the distance between the reference marks FM1 and FM2 provided in the flexible circuit board may be measured. When measuring the primary distance, a first distance L1 between the left reference mark FM1 defined in the first left dummy circuit line CL12 and the right reference mark FM2 defined in the first right dummy circuit line CL22 may be measured.

Referring to FIGS. 13 and 14B, after the second pressing process (S320), in the secondary distance measuring process (S420), the distance between the reference marks FM1' and FM2' provided in the flexible circuit board may be measured. When measuring the secondary distance, a second distance L2 between the left reference mark FM1' defined in the first left dummy circuit line CL12 and the right reference mark FM2' defined in the first right dummy circuit line CL22 may be measured.

When measuring the second distance L2, the first distance L1 and the second distance L2 may be easily determined based on the reference points SM1 and SM2 defined in the panel alignment marks ALM-P1 and ALM-P2. After the second pressing process (S320), positions of the reference marks FM1' and FM2' may be relatively largely changed due to the elongation of the flexible circuit board, but positions of the panel alignment marks ALM-P1 and ALM-P2 provided in the display panel may not be largely changed. Thus, the distance L2 between the reference marks FM1' and FM2' may be easily measured through coordinate calculation by coordinating the positions of the reference marks FM1' and FM2' by using the reference points SM1 and SM2 defined in the panel arraignment marks ALM-P1 and ALM-P2 as starting points.

The first distance L1 and the second distance L2 are different from each other. Since the low pressure and the heat having the low temperature are applied in the first pressing process (S310), deformation of the flexible circuit board may be relatively less. Thus, the positions of the reference markers FM1 and FM2 provided in the flexible circuit board may not be changed significantly from the positions of the reference markers FM1 and FM2, which are aligned initially. However, after the second pressing process (S320) in which the high temperature and the high pressure are applied, the positions of the reference markers FM1' and FM2' may be relatively largely changed, and thus the second distance L2 may be different from the first distance L1.

In the example method for manufacturing the display device, a cutoff part may be formed in the dummy circuit line of the flexible circuit board, and one end of the cut dummy circuit line may be used as a reference mark, or a reference mark formed in a predetermined pattern between the dummy line and the substrate alignment mark may be provided to easily and accurately measure the elongation of the flexible circuit board. More specifically, in the example method for manufacturing the display device, a reference mark capable of calculating coordinates based on a reference point of the panel alignment mark on the flexible circuit board may be provided to easily and accurately measure the elongation rate compared to the elongation rate based on the substrate pads. Therefore, the elongation rate of the flexible circuit board may be accurately measured when the display device is manufactured to improve the reliability of the display device manufactured through the manufacturing method according to the principles and embodiments of the invention.

The degree of the elongation of the flexible circuit board including the flexible base layer in the process of bonding the flexible circuit board to the display panel may be accurately measured to design the display device in consideration of the elongation rate of the flexible circuit board, thereby improving the reliability of the display device manufactured through the above-described method.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel including a plurality of display pads at least some of which extend in a first direction and are arranged in a second direction intersecting the first direction; and
   a flexible circuit board including a plurality of circuit pads, at least some of which are electrically connected to the plurality of display pads, and a plurality of circuit lines connected to the plurality of circuit pads, wherein the plurality of circuit pads comprises at least one dummy pad, and
the plurality of circuit lines includes a dummy circuit line, at least a portion of which is connected to the at least one dummy pad,
wherein the dummy circuit line comprises:
a first portion connected to the at least one dummy pad; and
a second portion spaced apart from the first portion by a gap.

2. The display device of claim 1, wherein the display panel further comprises a first indicia configured to overlap the plurality of display pads in the second direction.

3. The display device of claim 1, wherein the flexible circuit board further comprises a second indicia at least a portion of which is configured to overlap the plurality of circuit pads in the second direction.

4. The display device of claim 1, wherein the plurality of circuit pads further comprises a plurality of substrate pads configured to overlap the at least one dummy pad in the second direction,
wherein the plurality of display pads comprises:
a window pad or a panel dummy pad, which is electrically connected to the at least one dummy pad; and
input pads electrically connected to the plurality of substrate pads.

5. The display device of claim 4, further comprising a conductive adhesive film disposed between the display panel and the flexible circuit board to electrically connect the display pads to the substrate pads.

6. The display device of claim 1, wherein the first portion has a length less than a distance between the first portion and the second portion.

7. The display device of claim 1, wherein the flexible circuit board further comprises a circuit base layer on which the plurality of circuit pads and the plurality of circuit lines are disposed, and
wherein the circuit base layer comprises a flexible material.

8. The display device of claim 1, wherein the at least one dummy pad comprises:
a left dummy pad disposed at a left side of the flexible circuit board with respect to a central line of symmetry intersecting the flexible circuit board in the first direction; and
a right dummy pad disposed at a right side of the flexible circuit board with respect to the central line,
wherein the dummy circuit line comprises:
a left dummy circuit line comprising a first left portion connected to the left dummy pad and a second left portion spaced apart from the first left portion by a first gap; and
a right dummy circuit line comprising a first right portion connected to the right dummy pad and a second right portion spaced apart from the first right portion by a second gap.

9. The display device of claim 8, wherein an end of the first left portion and an end of the first right portion do not overlap each other in the second direction.

10. The display device of claim 1, wherein the flexible circuit board further comprises a data driving circuit connected to at least a portion of the plurality of circuit lines.

11. A display device comprising:
a display panel including a plurality of display pads at least some of which extend in a first direction and are arranged in a second direction intersecting the first direction; and
a flexible circuit board electrically connected to the display panel,
wherein the flexible circuit board comprises:
a plurality of circuit pads comprising substrate pads electrically connected to the plurality of display pads and at least one dummy pad disposed adjacent to the substrate pads;
a plurality of circuit lines comprising a dummy circuit line connected to the at least one dummy pad;
a first indicia disposed adjacent to the plurality of circuit lines; and
a reference point disposed on the dummy circuit line or disposed between the dummy circuit line and the first indicia.

12. The display device of claim 11, wherein the dummy circuit line comprises:
a first portion connected to the at least one dummy pad; and
a second portion spaced apart from the first portion by a gap,
wherein the reference point is defined on an end of the first portion.

13. The display device of claim 11, wherein the reference point disposed between the dummy circuit line and the first indicia, and the reference point having a generally rectangular, generally circular, or generally triangular shape.

14. The display device of claim 11, wherein the reference point comprises:
a left reference mark disposed at a left side of the flexible circuit board with respect to a central line of symmetry intersecting the flexible circuit board in the first direction; and
a right reference mark disposed at a right side of the flexible circuit board with respect to the central line of symmetry.

15. A method for manufacturing a display device, the method comprising:
preparing a display panel having a display area configured to display an image and a non-display area adjacent to the display area, and including a plurality of display pads and a first indicia disposed on the non-display area;
preparing a flexible circuit board including a plurality of circuit pads, a plurality of circuit lines connected to the plurality of circuit pads, a second indicia disposed adjacent to the plurality of circuit lines, and a plurality of reference points disposed on at least one of the plurality of circuit lines or disposed between two of the plurality of circuit lines and the second indicia;
pressing the display panel and the flexible circuit board together so that at least a portion of the plurality of circuit pads is electrically connected to the plurality of display pads; and
measuring a rate at which the flexible circuit board is elongated during the pressing of the flexible circuit board by measuring a distance between the plurality of reference points.

16. The method of claim 15, wherein the step of pressing the display panel and the flexible circuit board together comprises:
a first pressing process of pressing the display panel and the flexible circuit board at a first pressure; and
a second pressing process of pressing the display panel and the flexible circuit board at a second pressure greater than the first pressure.

17. The method of claim 16, wherein the step of measuring the elongation rate comprises:

measuring a first distance between the plurality of reference points before the second pressing process;

measuring a second distance between the plurality of reference marks after the second pressing process; and comparing the first distance with the second distance.

18. The method of claim 15, wherein the reference point comprises:

a left reference mark disposed at a left side of the flexible circuit board with respect to a central line of symmetry; and a right reference mark disposed at a right side of the flexible circuit board with respect to the central line of symmetry, wherein, the step of measuring of the elongation rate comprises measuring a distance between the left reference mark and the right reference mark.

19. The method of claim 15, wherein the plurality of circuit pads comprises at least one dummy pad, and the plurality of circuit lines comprises a dummy circuit line connected to the at least one dummy pad, wherein the dummy circuit line comprises:

a first portion connected to the at least one dummy pad; and a second portion spaced apart from the first portion by a gap, wherein the reference point is defined on an end of the first portion.

20. The method of claim 15, wherein the plurality of circuit pads comprises at least one dummy pad, the plurality of circuit lines comprises a dummy circuit line connected to the at least one dummy pad, and the reference point is disposed between the dummy circuit line and the second indicia, and the reference point having a generally rectangular, generally circular, or generally triangular shape.

* * * * *